US011977299B2

United States Patent
Yamamoto et al.

(10) Patent No.: US 11,977,299 B2
(45) Date of Patent: May 7, 2024

(54) POLARIZED LIGHT IRRADIATION DEVICE AND EXPOSURE METHOD FOR IRRADIATION TARGET OBJECT

(71) Applicant: FUJIFILM CORPORATION, Tokyo (JP)

(72) Inventors: Akira Yamamoto, Kanagawa (JP); Makoto Kamo, Kanagawa (JP)

(73) Assignee: FUJIFILM CORPORATION, Tokyo (JP)

( * ) Notice: Subject to any disclaimer, the term of this patent is extended or adjusted under 35 U.S.C. 154(b) by 296 days.

(21) Appl. No.: 17/674,857

(22) Filed: Feb. 18, 2022

(65) Prior Publication Data

US 2022/0171241 A1   Jun. 2, 2022

Related U.S. Application Data

(63) Continuation of application No. PCT/JP2020/026340, filed on Jul. 6, 2020.

(30) Foreign Application Priority Data

Sep. 30, 2019   (JP) .................................. 2019-179606

(51) Int. Cl.
  *G02F 1/1337*   (2006.01)
(52) U.S. Cl.
  CPC .. *G02F 1/133788* (2013.01); *G02F 1/133757* (2021.01)
(58) Field of Classification Search
  CPC ......... G02F 1/133757; G02F 1/133788; G02B 5/3016; G02B 5/30033
  See application file for complete search history.

(56) References Cited

U.S. PATENT DOCUMENTS 5,453,862 A   9/1995   Toko et al.
5,576,862 A   11/1996   Sugiyama et al.
(Continued)

FOREIGN PATENT DOCUMENTS

CN   107966885 A   4/2018
JP   H07-72484 A   3/1995
(Continued)

OTHER PUBLICATIONS

International Search Report issued in International Application No. PCT/JP2020/026340 dated Jul. 28, 2020.
(Continued)

*Primary Examiner* — Maurice C Smith
(74) *Attorney, Agent, or Firm* — SOLARIS Intellectual Property Group, PLLC

(57) ABSTRACT

A polarized light irradiation device of the present disclosure has: a light source unit which continuously emits polarized light; a light shaping unit which shapes the polarized light emitted from the light source unit into a preset shape to irradiate an irradiation target object with the shaped polarized light; a transport mechanism which transports the irradiation target object relative to the light source unit; and an interlocking mechanism which periodically and continuously changes a direction of linearly polarized light applied to the irradiation target object or an azimuthal angle of elliptically polarized light applied to the irradiation target object according to an amount of transport of the irradiation target object relative to the light source unit by the transport mechanism.

12 Claims, 13 Drawing Sheets

(56) References Cited

U.S. PATENT DOCUMENTS

| 2008/0226844 A1 | 9/2008 | Shemo et al. |
| 2014/0016081 A1 | 1/2014 | Kakubari et al. |
| 2015/0331167 A1 | 11/2015 | Escuti et al. |
| 2019/0041270 A1 | 2/2019 | Yanai et al. |
| 2020/0403187 A1 | 12/2020 | Saitoh et al. |

FOREIGN PATENT DOCUMENTS

| JP | 2006-133498 A | 5/2006 |
| JP | 2008-233903 A | 10/2008 |
| JP | 2012-215794 A | 11/2012 |
| JP | 2015-532468 A | 11/2015 |
| WO | 2017/169968 A1 | 10/2017 |
| WO | 2019/172270 A1 | 9/2019 |

OTHER PUBLICATIONS

Written Opinion of the ISA issued in International Application No. PCT/JP2020/026340 dated Jul. 28, 2020.
English language translation of the following: Office action dated Sep. 13, 2022 from the JPO in a Japanese patent application No. 2021-550346 corresponding to the instant patent application.

START OF IRRADIATION     TERMINATION OF IRRADIATION

POLARIZED LIGHT IRRADIATION DEVICE AND EXPOSURE METHOD FOR IRRADIATION TARGET OBJECT

CROSS-REFERENCE TO RELATED APPLICATIONS

This application is a continuation application of International Application No. PCT/JP2020/026340, filed Jul. 6, 2020, the disclosure of which is incorporated herein by reference in its entirety. Further, this application claims priority from Japanese Patent Application No. 2019-179606, filed on Sep. 30, 2019, the disclosure of which is incorporated herein by reference in its entirety.

BACKGROUND

1. Technical Field

A technology of the present disclosure relates to a polarized light irradiation device and an exposure method for an irradiation target object.

2. Description of the Related Art

There has been known a polarized light irradiation device which irradiates an alignment film such as a liquid crystal panel with polarized light to impart an alignment restricting force to liquid crystal molecules (for example, JP1995-72484A (JP-H7-72484A) and JP2006-133498A). In addition, there has been known a method of forming an alignment layer of an optical diffraction element by irradiating the alignment layer with polarized light (for example, JP2012-215794A).

The polarized light irradiation device described in JP1995-72484A (JP-H7-72484A) includes an optical system which narrows the laser light output from a laser light source, a polarizing plate which allows the passage of the laser light to provide linearly polarized laser light, and a movable stage which moves a substrate in two-dimensional directions X and Y. In the polarized light irradiation device, the substrate is irradiated with linearly polarized laser light that has passed through the polarizing plate.

The polarized light irradiation device described in JP2006-133498A has a light irradiation unit provided with a rod-like lamp and a wire grid polarization element, and irradiates a photo-alignment film of a work with light from the light irradiation unit while transporting the work, thereby performing a photo-alignment treatment on the photo-alignment film. The light irradiation unit is disposed so that a longitudinal direction thereof is along a width direction of the photo-alignment film (that is, a direction orthogonal to the transport direction). The length of the light irradiation unit in the longitudinal direction is equal to or longer than the width of the photo-alignment film. In the wire grid polarization element, the wire grids defining a polarizing axis are arranged in a fixed direction. The light of the lamp is converted into linearly polarized light by passing through the wire grid polarization element. The linearly polarized light is applied to the photo-alignment film from the light irradiation unit. Accordingly, it is possible to form a photo-alignment film having an alignment restricting force in the direction of the wire grids.

In the polarized light irradiation device described in JP2006-133498A, the light irradiation unit can be rotated around an axis orthogonal to the irradiation target surface of the photo-alignment film. By rotating the light irradiation unit, the polarizing axis can be set, for example, in a direction parallel to or orthogonal to the transport direction of the photo-alignment film, or in a direction inclined by 45° with respect to the transport direction. The rotation angle of the light irradiation unit is set before starting the photo-alignment treatment, and is fixed during the photo-alignment treatment. Therefore, during the photo-alignment treatment, the direction of the polarizing axis of the linearly polarized light is fixed in one direction.

In the method of forming an alignment layer of an optical diffraction element described in JP2012-215794A, a specific small region is exposed by polarized light having a polarization direction in the y-direction using a mask disposed in the y-direction, and then the mask is shifted in the y-direction by the width of the small region to expose a small region next to the previously exposed small region by polarized light whose polarization direction is rotated to a preset angle. By repeating this step, an alignment layer of an optical diffraction element is formed.

SUMMARY

In the polarized light irradiation device described in JP1995-72484A (JP-H7-72484A), since the polarizing plate is moved for each beam spot corresponding to a minute region to irradiate the substrate with linearly polarized laser light, many minute regions having different alignment directions are formed in the substrate.

In the method of forming an alignment layer described in JP2012-215794A, since the mask is shifted by the width of the small region to perform the exposure, an alignment pattern having clearly discontinuous parts where the alignment is formed in the alignment layer.

As described above, in both JP1995-72484A (JP-H7-72484A) and JP2012-215794A, an alignment pattern having parts where the alignment is clearly discontinuous is formed in the alignment layer. That is, since the region where the alignment is discontinuous is included, alignment characteristics which continuously change in any region may not be obtained.

In addition, as described above, in the polarized light irradiation device described in JP2006-133498A, the direction of the polarizing axis can be changed by changing the rotation angle of the light irradiation unit. However, since the rotation angle of the light irradiation unit is fixed during the photo-alignment treatment, it is difficult to continuously change the alignment direction. It is possible to change the rotation angle of the light irradiation unit while temporarily stopping the transport of the photo-alignment film. However, in this case, a region where the alignment is discontinuous in the transport direction is formed as shown in FIG. 15 of JP2006-133498A.

The present disclosure has been made in view of the above circumstances, and an object thereof is to provide a polarized light irradiation device capable of forming an alignment pattern in which the alignment direction continuously changes, and an exposure method for an irradiation target object.

In order to achieve the above object, a polarized light irradiation device of the present disclosure has: a light source unit which continuously emits polarized light; a light shaping unit which shapes the polarized light emitted from the light source unit into a preset shape to irradiate an irradiation target object with the shaped polarized light; a transport mechanism which transports the irradiation target object relative to the light source unit; and an interlocking mechanism which periodically and continuously changes a direction of linearly polarized light or an azimuthal angle of elliptically polarized light applied to the irradiation target object according to an amount of transport of the irradiation target object relative to the light source unit by the transport mechanism.

It is preferable that the light source unit has a longitudinal direction, and the transport mechanism transports the irradiation target object in a direction orthogonal to the longitudinal direction of the light source unit.

It is preferable that a length of the light source unit in the longitudinal direction is longer than a width of the irradiation target object in a direction orthogonal to a transport direction of the irradiation target object.

It is preferable that the light shaping unit shapes a width of the polarized light in a transport direction of the irradiation target object into a preset width.

It is preferable that the light shaping unit includes a plate-like body in which an opening corresponding to the width of the polarized light is formed.

It is preferable that the opening is disposed in a posture in which a longitudinal direction of the opening is inclined with respect to the transport direction of the irradiation target object.

It is preferable that an inclined angle changing unit which changes an inclined angle at which the opening is inclined is included.

It is preferable that the opening has a rectangular shape having a long side along a width direction of the irradiation target object or a curved shape curved in the width direction of the irradiation target object.

It is preferable that the polarized light emitted from the light source unit is linearly polarized light, and the interlocking mechanism continuously changes the direction of the linearly polarized light applied to the irradiation target object.

It is preferable that the interlocking mechanism is capable of changing at least one of a transportation speed of the irradiation target object transported by the transport mechanism or a rotation speed at which the direction of the linearly polarized light or the azimuthal angle of elliptically polarized light is rotated.

It is preferable that the irradiation target object has a photo-alignment film applied on a support.

An exposure method for an irradiation target object of the present disclosure has: an irradiation step of transporting the irradiation target object in a direction orthogonal to a longitudinal direction of a light source unit, and shaping polarized light continuously emitted from the light source unit into a preset shape to irradiate the irradiation target object with the shaped polarized light; and an interlocking step of periodically and continuously changing a direction of linearly polarized light or an azimuthal angle of elliptically polarized light continuously applied to the irradiation target object according to an amount of transport of the irradiation target object relative to the light source unit during the irradiation step.

According to the technology of the present disclosure, it is possible to form an alignment pattern in which the alignment direction continuously changes.

BRIEF DESCRIPTION OF THE DRAWINGS

Exemplary embodiments according to the technique of the present disclosure will be described in detail based on the following figures, wherein.

DETAILED DESCRIPTION

First Embodiment

Figure 1:
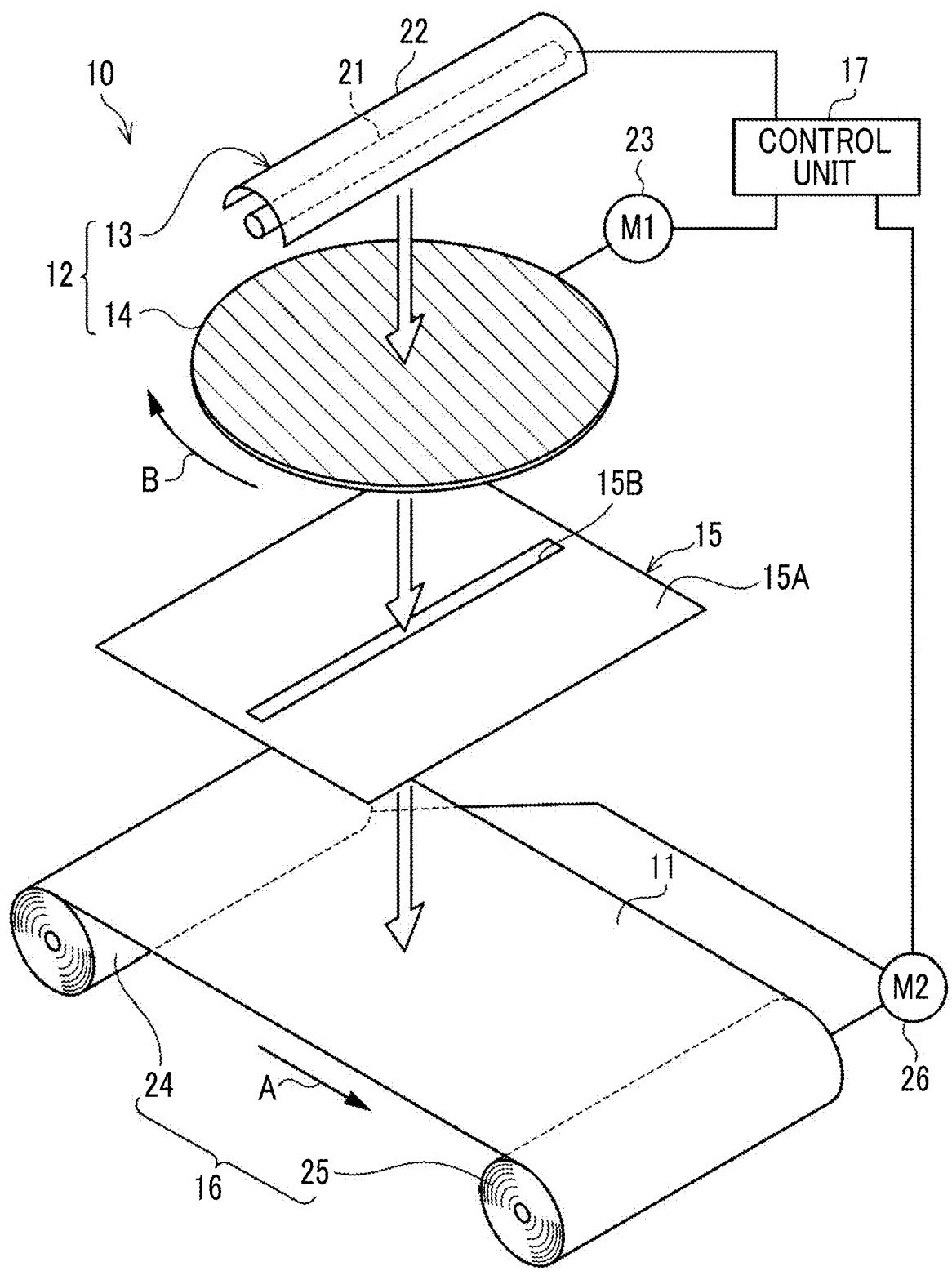
FIG. 1 is a perspective view showing an overall configuration of a polarized light irradiation device of a first embodiment.

For example, as shown in FIG. 1, a polarized light irradiation device 10 irradiates an irradiation target object 11 with polarized light. For example, the irradiation target object 11 has a configuration in which a photo-alignment film is applied on a surface of a long support. The polarized light irradiation device 10 forms an alignment pattern on the photo-alignment film of the irradiation target object 11 by irradiating the photo-alignment film of the irradiation target object 11 with polarized light.

The polarized light irradiation device 10 includes a light source unit 12 which continuously emits polarized light. The light source unit 12 includes a light emitting unit 13 and a polarizing plate 14. In addition, the polarized light irradiation device 10 includes a light shaping unit 15 which shapes the polarized light emitted from the light source unit 12 to irradiate the irradiation target object 11 with the shaped polarized light, and a transport device 16 which transports the irradiation target object 11 relative to the light source unit 12. Furthermore, the polarized light irradiation device 10 includes a control unit 17 which controls the operations of the light source unit 12 and the transport device 16. Here, the transport device 16 is an example of a transport mechanism.

The light emitting unit 13 includes a lamp 21 which continuously emits light, and a reflector 22 which is disposed on the side opposite to the polarizing plate 14 with respect to the lamp 21. The lamp 21 has a rod shape, and for example, has a cylindrical shape having a length in a longitudinal direction. The lamp 21 is composed of, for example, a high-pressure mercury lamp or the like. The lamp 21 is disposed so that the longitudinal direction (for example, pipe axis direction) of the lamp 21 is along a width direction orthogonal to the longitudinal direction of the long irradiation target object 11. The length of the lamp 21 in the longitudinal direction is set to be, for example, equal to or longer than the length of the irradiation target object 11 in the width direction. In the first embodiment, the irradiation target object 11 is transported in a direction of the arrow A orthogonal to the longitudinal direction (that is, the width direction of the irradiation target object 11) of the lamp 21. The lamp 21 is electrically connected to the control unit 17.

The length of the reflector 22 in a longitudinal direction is set to be equal to or longer than the length of the lamp 21 in the longitudinal direction. The reflector 22 has a semicircular cross-section orthogonal to the longitudinal direction, and covers approximately half of an outer peripheral surface of the lamp 21. The reflector 22 reflects the light emitted from the lamp 21 in the direction of the polarizing plate 14.

The polarizing plate 14 functions to allow the passage of only polarized light whose electric field oscillates in a specific direction and to block other light. The light emitted from the light emitting unit 13 is natural light having no regularity in the oscillation direction and contains components in various oscillation directions. The polarizing plate 14 allows the passage of only polarized light whose oscillation direction is a specific direction. More specifically, the polarizing plate 14 allows the passage of only linearly polarized light whose oscillation direction is constant with respect to the traveling direction of the light. The polarizing plate 14 converts the light of the lamp 21 into linearly polarized light having a polarizing axis in a specific direction. The polarizing plate 14 has, for example, a circular shape. For example, the diameter of the polarizing plate 14 is set to be equal to or longer than the length of the irradiation target object 11 in the width direction. The polarizing axis of the polarizing plate 14 aligns in a fixed direction in the whole region of the polarizing plate 14.

Since the light source unit 12 includes the light emitting unit 13 and the polarizing plate 14, it continuously emits polarized light. Here, "continuously" means that the emission is not intermittent emission.

Figure 2:
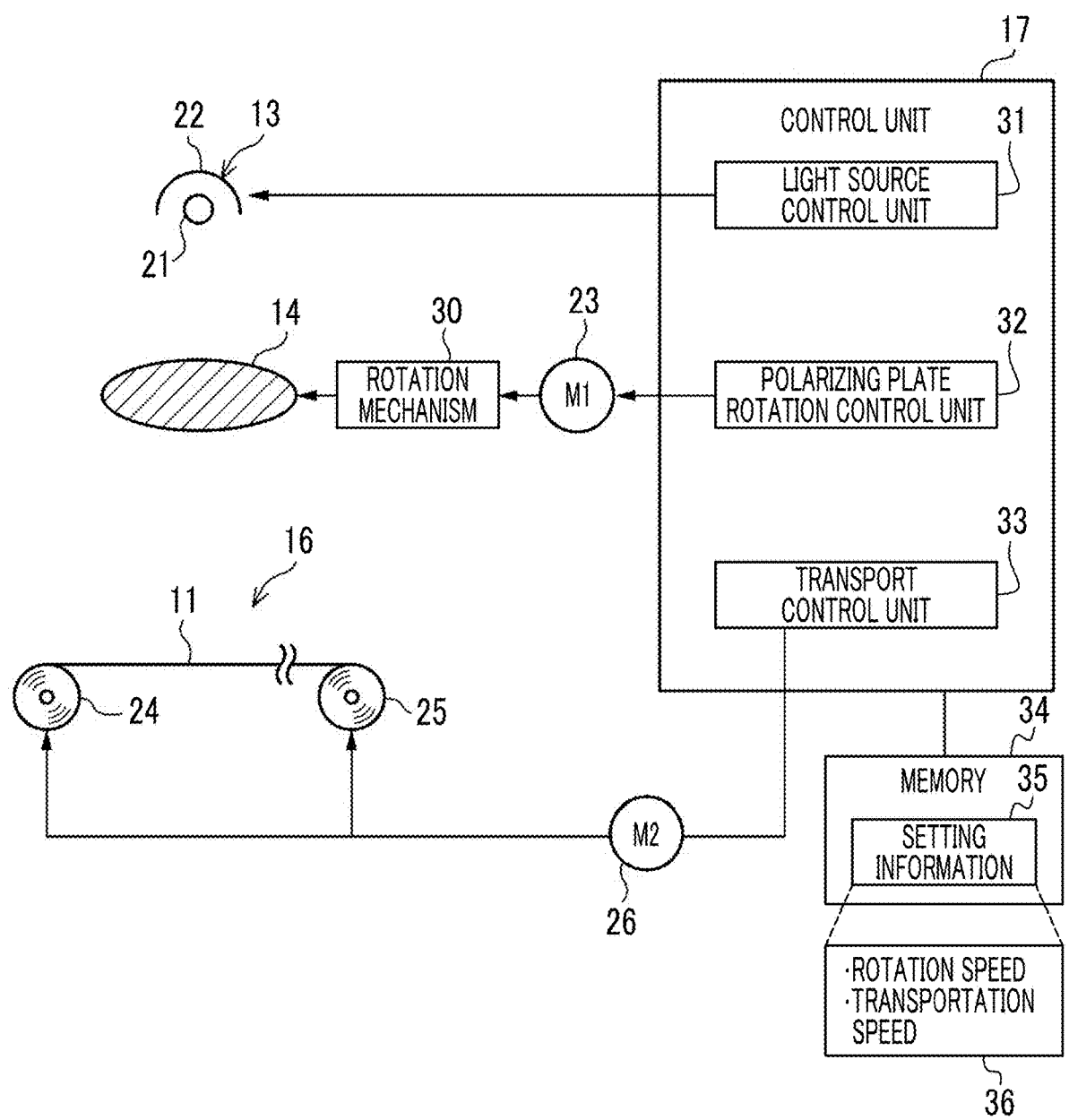
FIG. 2 is a block diagram showing an electric configuration of the polarized light irradiation device.

The polarized light irradiation device 10 includes a motor (M1) 23 which rotates the polarizing plate 14 in a predetermined direction (for example, direction of the arrow B) via a rotation mechanism 30 (see FIG. 2). The motor 23 is electrically connected to the control unit 17.

The light shaping unit 15 shapes the polarized light emitted from the light source unit 12 into a preset shape to irradiate the irradiation target object 11 with the shaped polarized light. In the light shaping unit 15 of the first embodiment, an opening 15B through which light passes is formed in a rectangular plate-like body 15A which does not transmit light. The opening 15B shapes the polarized light incident on the plate-like body 15A from the light source unit 12. The opening 15B is formed at a central portion of the plate-like body 15A. The opening 15B is, for example, a rectangular slit, and the length of the opening 15B in a longitudinal direction is set to be equal to or longer than the length of the irradiation target object 11 in the width direction. The longitudinal direction of the opening 15B extends in the longitudinal direction of the light source unit 12. Therefore, the longitudinal direction of the opening 15B extends in a direction (for example, width direction of the irradiation target object 11) orthogonal to the transport direction of the irradiation target object 11 (for example, direction of the arrow A).

The light shaping unit 15 functions to pass the polarized light emitted from the light source unit 12 through the opening 15B to shape the width of the polarized light in the transport direction (for example, direction of the arrow A) of the irradiation target object 11 into a preset width. In other words, the light shaping unit 15 defines the irradiation width of the polarized light in the transport direction of the irradiation target object 11 by the opening 15B.

The transport device 16 includes a delivery roll 24 which sends the long irradiation target object 11 in the longitudinal direction, and a winding roll 25 which winds up the irradiation target object 11. The delivery roll 24 and the winding roll 25 are disposed with an interval therebetween, and an axial direction of the delivery roll 24 and an axial direction of the winding roll 25 are substantially parallel to each other. The lengths of the delivery roll 24 and the winding roll 25 in the axial direction are longer than the length of the irradiation target object 11 in the width direction.

A motor (M2) 26 is connected to the winding roll 25 and the delivery roll 24. The motor 26 is electrically connected to the control unit 17. The winding roll 25 and the delivery roll 24 are configured to be rotated at substantially the same speed, or configured so that the winding roll 25 is rotated slightly faster than the delivery roll 24. A driving force is transferred from the motor 26 to rotate the winding roll 25 and the delivery roll 24, and the irradiation target object 11 is thus transported in a direction (that is, direction of the arrow A) orthogonal to the width direction.

FIG. 2 is a block diagram showing an electric configuration of the polarized light irradiation device 10. As shown in FIG. 2, the control unit 17 includes a light source control unit 31 which controls the light emitting unit 13, a polarizing plate rotation control unit 32 which controls the rotation of the polarizing plate 14, and a transport control unit 33 which controls the transport device 16. The light source control unit 31 controls the light emission amount, emission timing, and the like of the light emitting unit 13. The polarizing plate rotation control unit 32 controls the rotation speed, driving timing, and the like of the motor 23 which rotates the polarizing plate 14. The transport control unit 33 controls the rotation speed, driving timing, and the like of the motor 26 which rotates the delivery roll 24 and the winding roll 25.

A memory 34 is provided outside the control unit 17. The memory 34 is electrically connected to the control unit 17. Setting information 35 is stored in the memory 34. As the setting information 35, information 36 such as the rotation speed of the polarizing plate 14 and the transportation speed of the irradiation target object 11 is set. Here, the control unit 17 (for example, polarizing plate rotation control unit 32, transport control unit 33), the motor 23, and the motor 26 are an example of an interlocking mechanism.

Figure 3A:
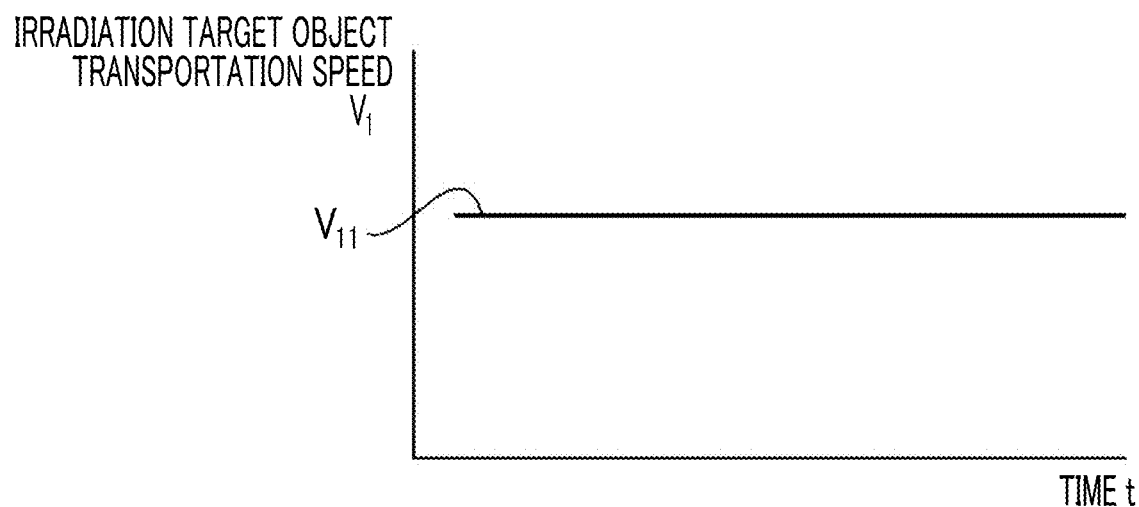
FIG. 3A is a graph showing a first example of a relationship between a time and a transportation speed of an irradiation target object.
Figure 3B:
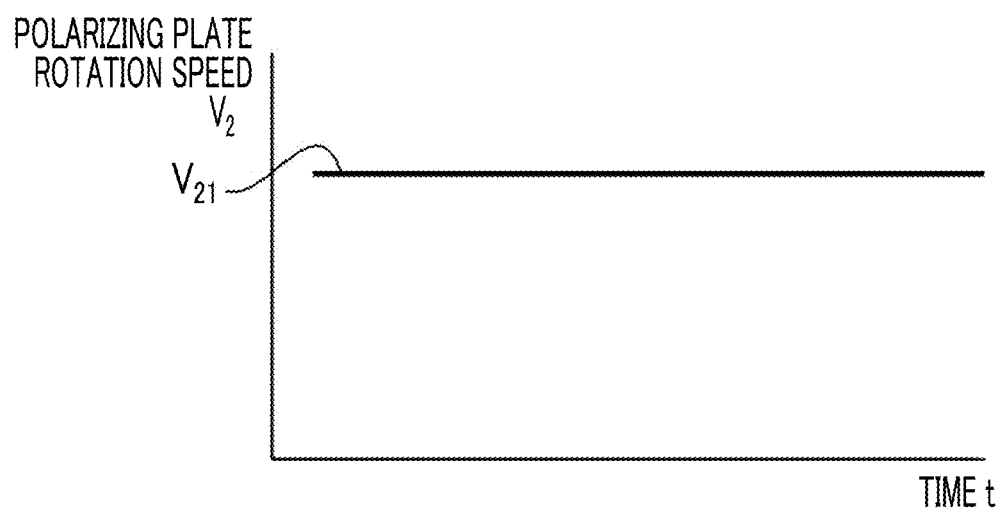
FIG. 3B is a graph showing a first example of a relationship between a time and a rotation speed of a polarizing plate.

FIG. 3A shows a relationship between a time t and a transportation speed V1 of the irradiation target object 11. In addition, FIG. 3B shows a relationship between a time t and a rotation speed V2 of the polarizing plate 14. As shown in FIG. 3A, the transportation speed V1 of the irradiation target object 11 with respect to the time t is set to a constant value (for example, V11). In addition, as shown in FIG. 3B, the rotation speed V2 of the polarizing plate 14 with respect to the time t is set to a constant value (for example, V21). That is, the amount of transport of the irradiation target object 11 and the amount of rotation of the polarizing plate 14 are constant.

As shown in FIG. 2, the transport control unit 33 controls the transportation speed of the irradiation target object 11 to a constant value (for example, V11) by controlling the rotation speed of the motor 26. Furthermore, the polarizing plate rotation control unit 32 controls the rotation speed of the polarizing plate 14 to a constant value (for example, V21) by controlling the rotation speed of the motor 23. That is, the control unit 17 rotates the polarizing plate 14 according to the amount of transport of the irradiation target object 11 relative to the light source unit 12 by the transport device 16. In the first embodiment, since the transportation speed of the irradiation target object 11 and the rotation speed of the polarizing plate 14 are constant, the polarizing plate 14 is rotated by a preset angle according to the unit amount of transport of the irradiation target object 11. Accordingly, the direction (that is, direction of the polarizing axis) of the linearly polarized light applied to the irradiation target object 11 can be periodically and continuously changed. Here, "continuously" means that the change of the direction of the linearly polarized light is not intermittent.

Figure 4A:
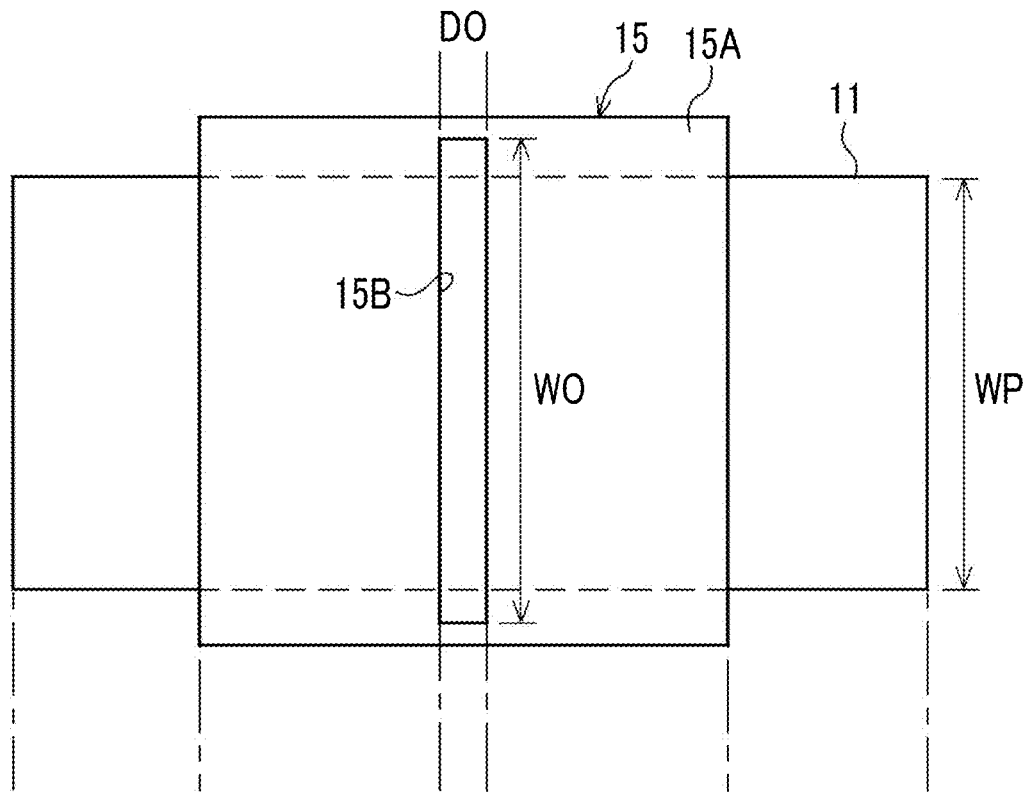
FIG. 4A is a plan view showing a light shaping unit and an irradiation target object.
Figure 4B:
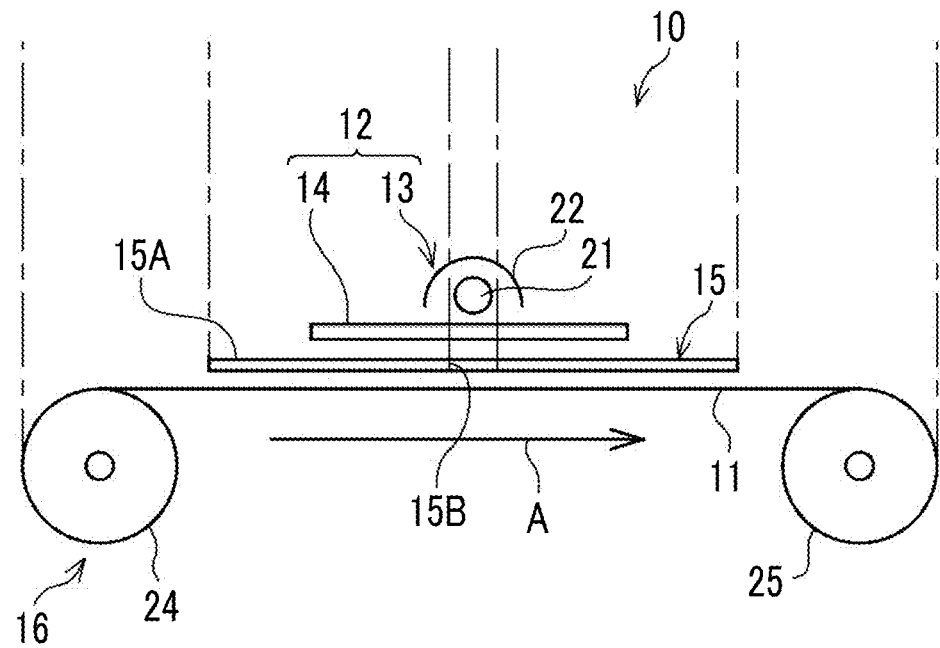
FIG. 4B is a side view showing the polarized light irradiation device.

In addition, in FIG. 1, the light source unit 12, the light shaping unit 15, and the irradiation target object 11 are shown with intervals therebetween in order to show the configuration of each unit in an easy-to-understand manner, but actually, the light source unit 12, the light shaping unit 15, and the irradiation target object 11 are disposed in close proximity to each other as shown in FIG. 4B. Accordingly, as for the light from the light source unit 12, only the polarized light that has passed through the opening 15B reaches the irradiation target object 11. In addition, as shown in FIG. 4A, the length (WO) of the opening 15B in the longitudinal direction is sufficiently long with respect to the width (WP) of the irradiation target object 11. Therefore, the polarized light is uniformly applied in the width direction of the irradiation target object 11.

Figure 5:
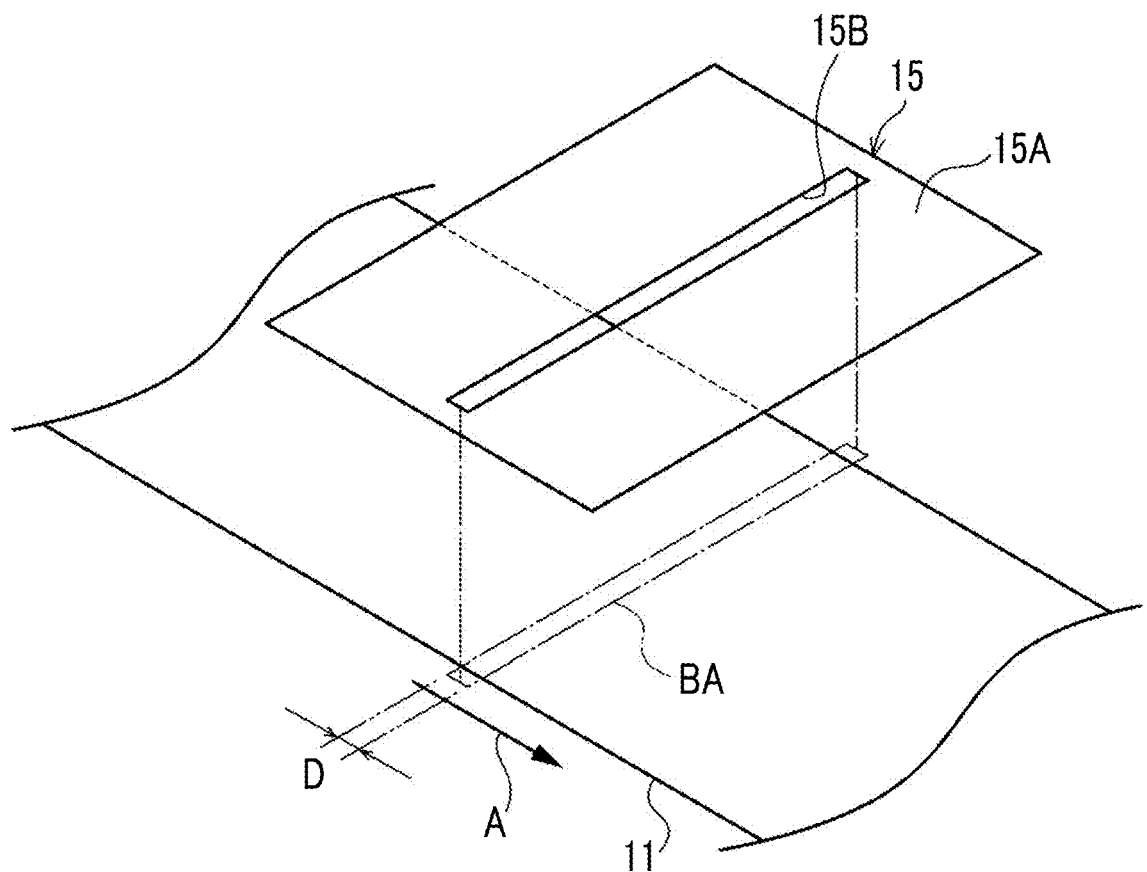
FIG. 5 is a perspective view showing a first example of the light shaping unit and the irradiation target object of the polarized light irradiation device.

FIG. 5 shows an irradiated region BA on the irradiation target surface of the irradiation target object 11 irradiated with the polarized light shaped by the opening 15B of the light shaping unit 15. The width of the polarized light is shaped into a shape preset by the opening 15B. The irradiated region BA at a certain timing has a strip shape which is long in the width direction of the irradiation target object 11, corresponding to the shape of the elongated slit-shaped opening 15B. An irradiation width D of the irradiated region BA in the transport direction is determined by the width of the opening 15B. Since the irradiation target object 11 is transported in the direction of the arrow A, the respective regions of the irradiation target object 11 pass through the opening 15B. Therefore, the polarized light that has passed through the opening 15B is uniformly applied even in the transport direction of the irradiation target object 11.

In addition, the polarizing plate 14 is rotated while the irradiation target object 11 is transported, and thus the direction of the polarizing axis of the polarized light passing through the opening 15B is also periodically changed between 0° and 180°.

The polarized light irradiation device 10 of the present disclosure has been described using the light source unit 12 including the light emitting unit 13 and the polarizing plate 14. However, the light source unit 12 may continuously emit polarized light, and for example, in a case where the light emitting unit 13 can emit polarized light, the polarizing plate 14 may not be necessarily included. In this case, by combination with a mechanism in which the angle of the polarizing axis of the polarized light passing through the opening 15B is rotated with respect to the irradiation target object 11, it is possible to perform the same irradiation as described above. As an example requiring no polarizing plate, for example, a configuration in which a laser light source, a fixed λ/4 plate, and a rotating λ/4 plate are combined may be used. For example, linearly polarized light may be emitted from a laser light source, converted into circularly polarized light by a fixed λ/4 plate, converted into linearly polarized light having a polarizing axis direction according to the rotation by a rotating λ/4 plate, and applied.

Figure 6:
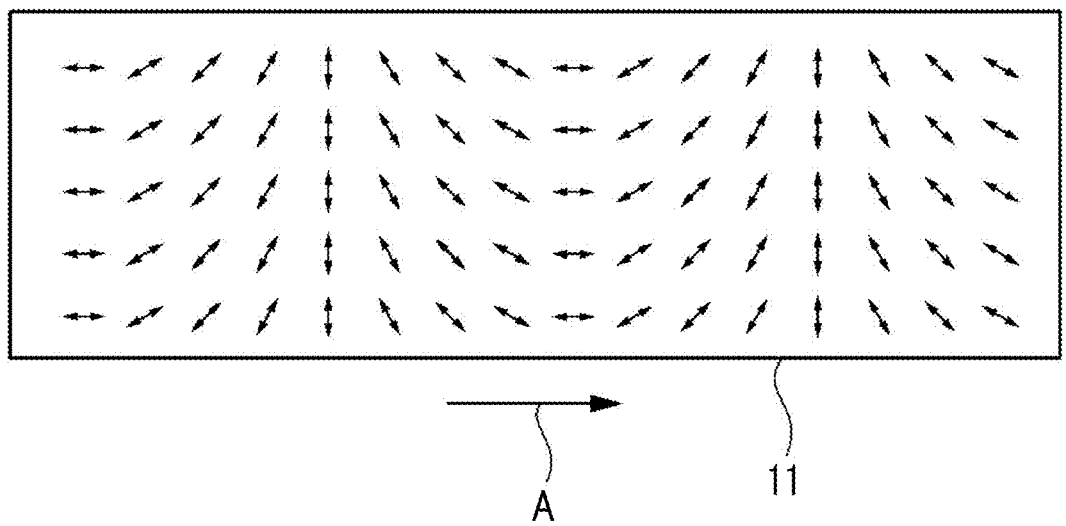
FIG. 6 is a plan view showing a first example of an alignment pattern formed on an irradiation target surface of the irradiation target object.

FIG. 6 shows an alignment pattern of the photo-alignment film in a case where the irradiation target object 11 is subjected to a photo-alignment treatment by the polarized light irradiation device 10. As shown in FIG. 6, on the photo-alignment film of the irradiation target object 11, an alignment pattern having periodicity in which the alignment direction periodically changes between 0° and 180° according to the periodic change of the polarizing axis is formed. The change of the alignment direction on the photo-alignment film corresponding to the polarizing axis is continuous, and no clear boundary or discontinuous region is generated.

In the first embodiment, the alignment direction parallel to the transport direction is defined as 0°, and the alignment direction orthogonal to the transport direction (for example, the width direction of the irradiation target object 11) is defined as 90°.

Here, a mechanism by which the alignment pattern having continuous periodicity as described above is formed on the photo-alignment film of the irradiation target object 11 will be described.

More specifically, the mechanism of exposure by the polarized light irradiation device 10 of the first embodiment and exhibition of an alignment restricting force will be described.

Figure 7A:
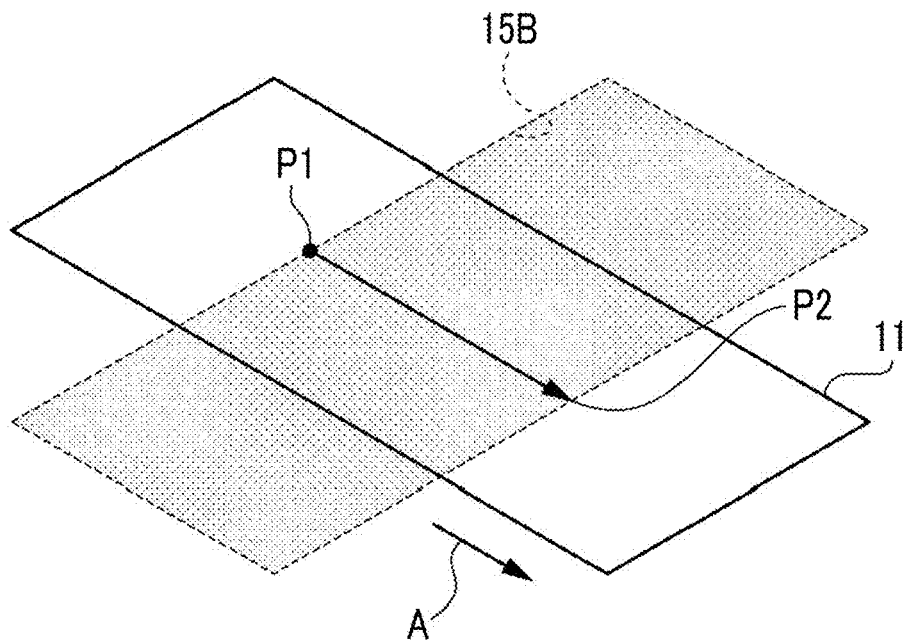
FIG. 7A is a plan view showing a state from the start to termination of exposure when the irradiation target object is transported.
Figure 7B:
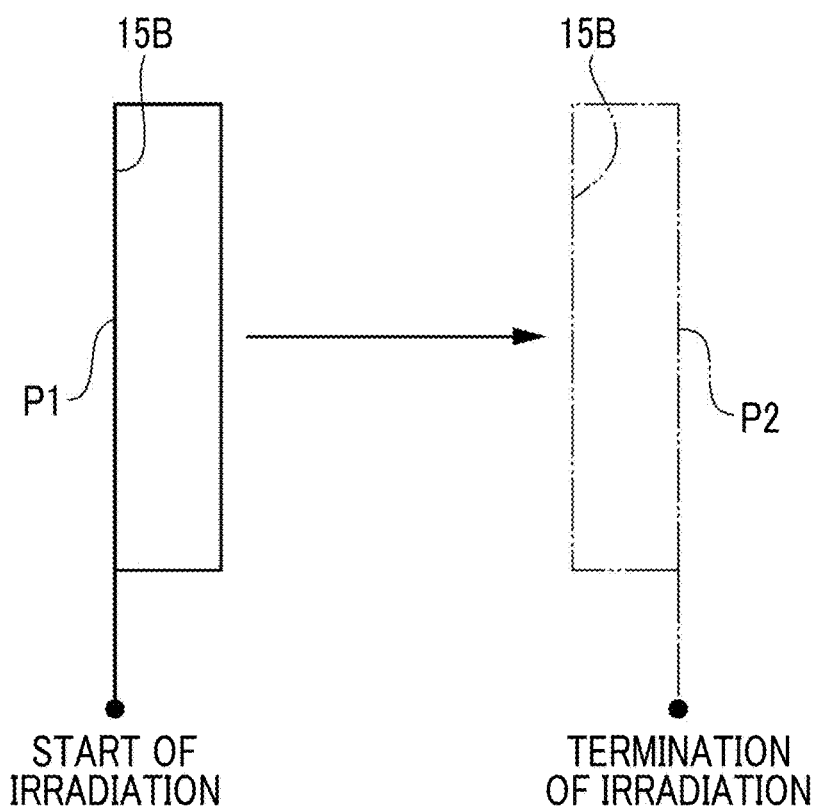
FIG. 7B is a perspective view showing an area from the start to termination of exposure in a transport direction of the irradiation target object.

As shown in FIGS. 7A and 7B, in a case where the irradiation target object 11 is transported in the direction of the arrow A, the irradiation target object 11 passes through a position facing the opening 15B of the light shaping unit 15. Focusing on a certain line of the irradiation target object 11, the irradiation with polarized light is started at a position P1 corresponding to one edge portion of the opening 15B in a direction (that is, transport direction) orthogonal to the longitudinal direction, and is terminated when the irradiation target object 11 reaches a position P2 corresponding to the other edge portion of the opening 15B. Hereinafter, the position P1 will be referred to as the exposure start position for a certain line, and the position P2 will be referred to as the exposure termination position.

Figure 8:
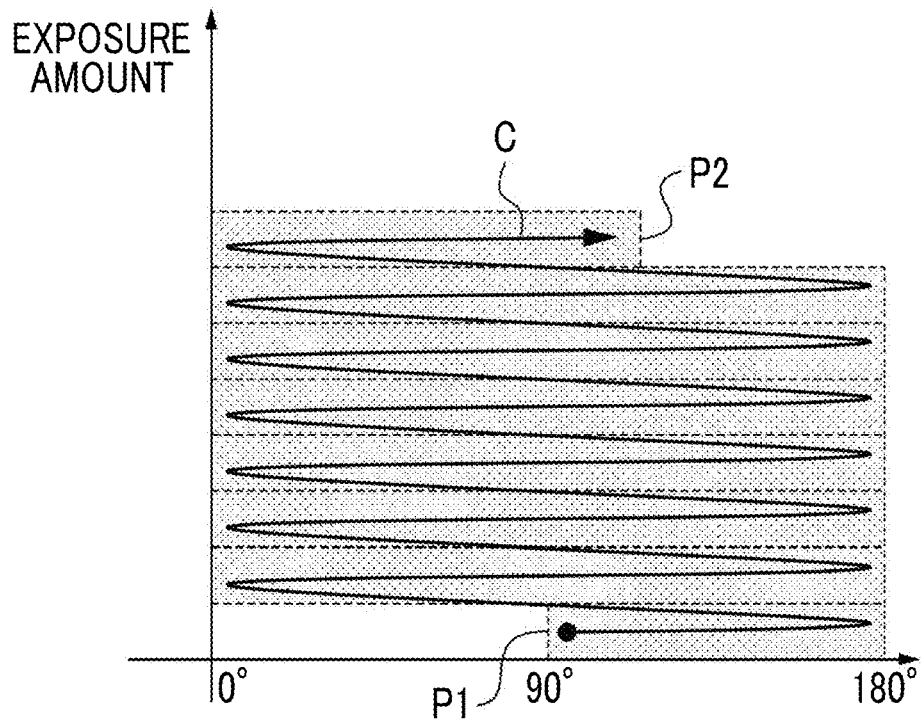
FIG. 8 is a graph showing a relationship between a rotation angle of the polarizing plate and an exposure amount of polarized light from the start to termination of exposure of the irradiation target object.

FIG. 8 shows a relationship between the angle by which the polarizing plate 14 is rotated with respect to the reference position and the exposure amount of the polarized light on the irradiation target object 11 during the period from when a certain line of the irradiation target object 11 reaches the exposure start position P1 and the irradiation with the polarized light is started to when the line reaches the exposure termination position P2 and the irradiation with the polarized light is terminated. The rotation speed of the polarizing plate 14 is set to a speed at which the polarizing plate is rotated by 180° or greater during the exposure period in which a certain line of the irradiation target object 11 reaches the exposure termination position P2 from the exposure start position P1. Specifically, as shown in FIG. 8, while a certain line of the irradiation target object 11 passes through the opening 15B of the light shaping unit 15, the polarizing plate 14 is rotated by a rotation angle of 7 or more times 180° as shown by the arrow C. In a case where the polarizing plate 14 is rotated by 180°, the polarizing axis of linearly polarized light is rotated by 180°. Accordingly, in a case where linearly polarized light whose polarizing axis is rotated by 180° is applied to the same location, the alignment restricting force is exhibited in the whole region of 0° to 180°, and thus the alignment restricting force in a specific direction is canceled in an entire view and is not exhibited. In the example of FIG. 8, the exposure energy of the linearly polarized light applied while the polarizing plate 14 is rotated by 1260°, that is 7 times 180°, does not contribute to the alignment restricting force.

Figure 9:
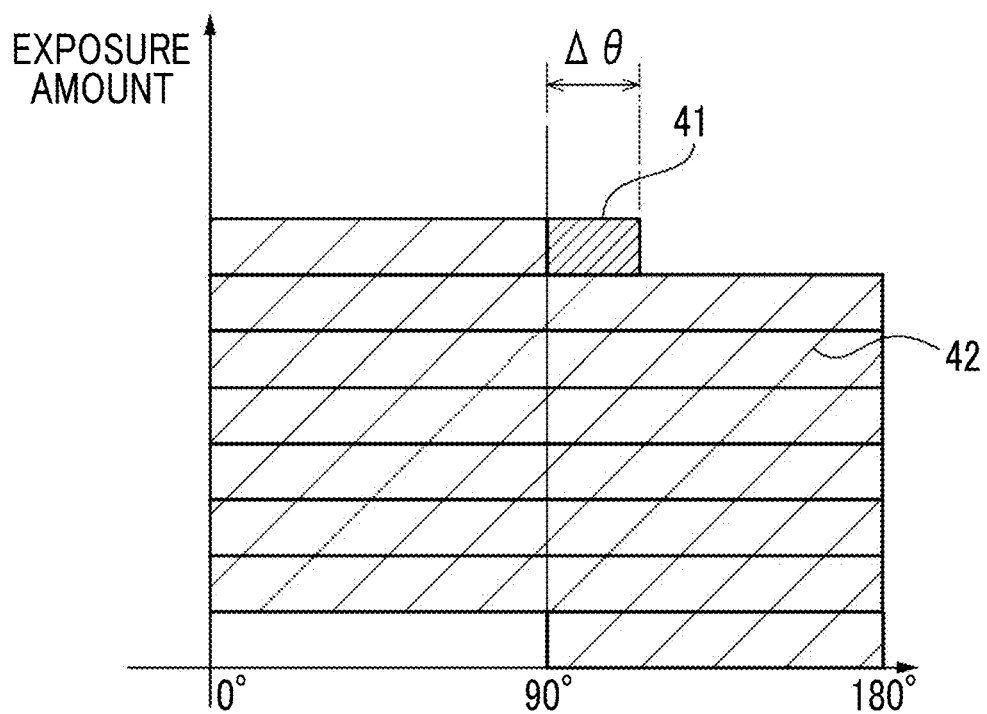
FIG. 9 is a diagram illustrating a mechanism of exhibition of an alignment restricting force on the irradiation target object.

As shown in FIG. 9, in a region 42 (see FIG. 8) where the polarizing plate 14 is rotated by 180°, the polarizing axis directions cancel out each other, and the exposure energy does not contribute to the exhibition of the alignment restricting force. Therefore, in a region 41 from about 90° to about 115° after rotation of the polarizing plate 14 by a rotation angle that is an integral multiple of 180°, the exposure energy contributes to the exhibition of the alignment restricting force. In the example of FIG. 9, the alignment direction is about 100°, that is an average of about 90° to about 110°.

Figure 10:
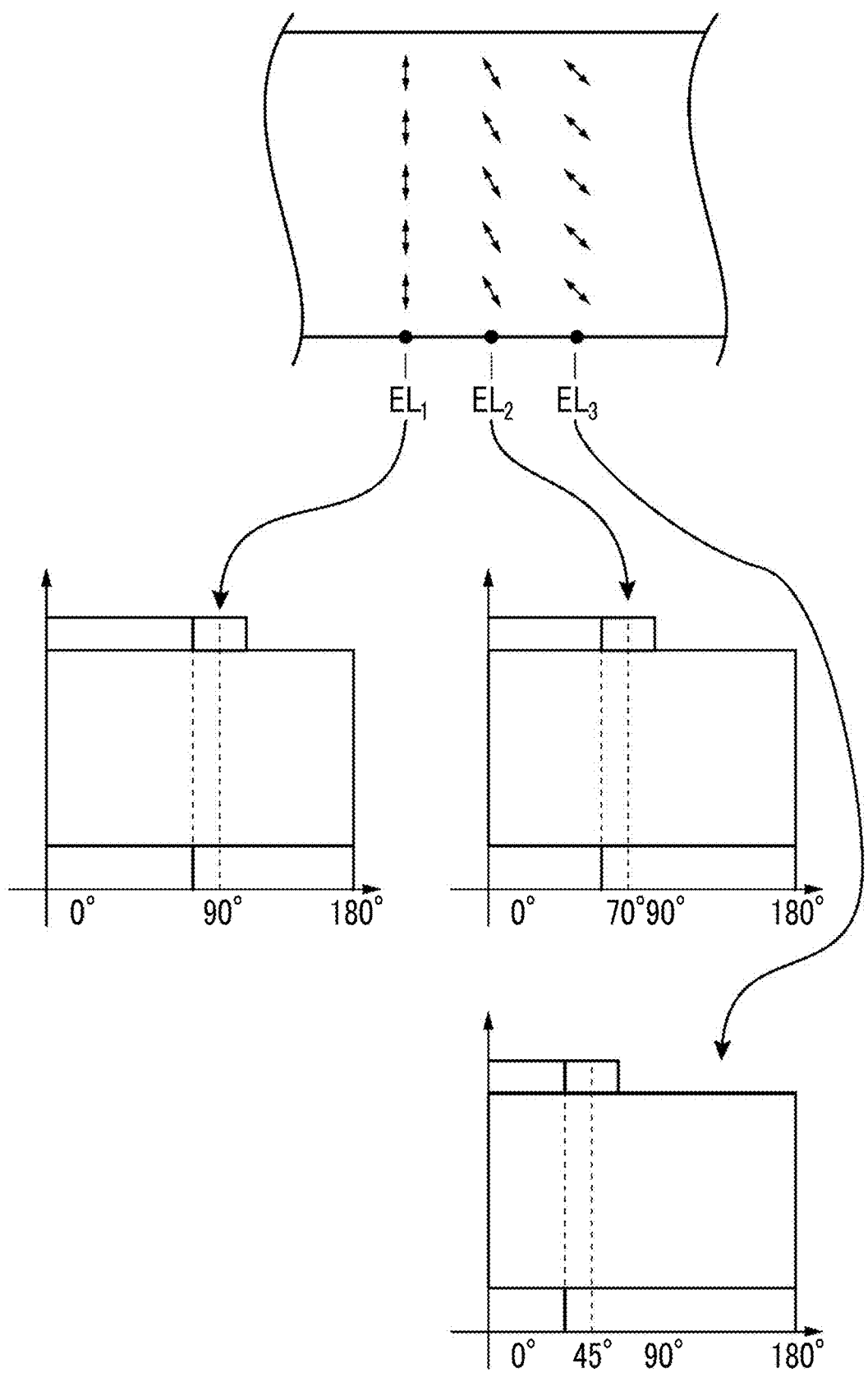
FIG. 10 is a diagram illustrating alignment directions formed on the irradiation target object.

As shown in FIG. 10, since the irradiation target object 11 is transported, the angle of the polarizing axis at the exposure start position P1 for each line changes. Therefore, the average angle of the polarizing axis of the region 41 contributing to the exhibition of the alignment restricting force, that is, the alignment direction changes for each line. FIG. 10 shows an aspect in which the alignment direction changes according to the transport direction, such that with respect to the transport direction of the irradiation target object 11, the alignment direction of a certain line EL1 is about 90°, the alignment direction of another line EL2 is about 70°, and the alignment direction of yet another line EL3 is about 45°. In addition, since the polarizing plate 14 is rotated, the change of the alignment direction has periodicity between 0° and 180°.

In the above example, the description has been given using a concept of line. However, the concept of line is used only for convenience of the description, and actually, a line at which a clear boundary is generated is not generated. This is because since the irradiation target object 11 is continuously transported and the polarizing plate 14 is continuously rotated, the alignment direction continuously changes in the transport direction.

(Actions and Effects)

Next, actions and effects of the first embodiment will be described.

In the polarized light irradiation device 10, polarized light is continuously emitted by the light source unit 12. The polarized light emitted from the light source unit 12 is shaped into a preset shape by the light shaping unit 15, and is then applied to the irradiation target object 11. In addition, by the transport device 16, the irradiation target object 11 is transported in the direction of the arrow A with respect to the light source unit 12. Furthermore, the control unit 17 rotates the polarizing plate 14 at a predetermined speed according to the amount of transport of the irradiation target object 11 relative to the light source unit 12 by the transport device 16. Accordingly, the direction of the linearly polarized light applied to the irradiation target object 11 is periodically and continuously changed.

Accordingly, as shown in FIG. 6, an alignment pattern in which the alignment direction continuously and periodically changes between 0° and 180° in the direction of the arrow A coinciding with the transport direction is formed on the photo-alignment film of the irradiation target object 11.

In addition, in the polarized light irradiation device 10 of the first embodiment, the transportation speed V1 of the irradiation target object 11 is controlled to be constant, and the rotation speed V2 of the polarizing plate 14 is controlled to be constant (see FIGS. 3A and 3B). Therefore, the period in which the alignment direction changes in the alignment pattern is constant. The irradiation target object 11 having the above-described alignment pattern can be used as, for example, a diffraction element.

In the above-described polarized light irradiation device 10, since the direction of the linearly polarized light continuously applied to the irradiation target object 11 is periodically changed according to the amount of transport of the irradiation target object 11 relative to the light source unit 12, no clear boundary or discontinuous region is generated in the irradiated portion of the irradiation target object 11. Therefore, an alignment pattern having periodicity in which the alignment direction continuously changes can be formed in the irradiated portion of the irradiation target object 11.

In addition, in the polarized light irradiation device 10, the light source unit 12 has a longitudinal direction, and the transport device 16 transports the irradiation target object 11 in a direction orthogonal to the longitudinal direction of the light source unit 12. Therefore, in the polarized light irradiation device 10, it is possible to irradiate a wide range of the irradiation target object 11 in the width direction with polarized light, and the polarized light can be efficiently applied. That is, the irradiation time of the polarized light on the irradiation target object 11 can be shortened. Furthermore, the length of the light source unit 12 in the longitudinal direction is longer than a width WP of the irradiation target object 11. Therefore, the polarized light can be uniformly applied over the whole width of the irradiation target object 11.

In addition, in the polarized light irradiation device 10, the light shaping unit 15 shapes the width of the polarized light in the transport direction of the irradiation target object 11 into a preset width. Accordingly, the irradiation width D of the polarized light in the photo-alignment film of the irradiation target object 11 is limited. The polarizing axis is rotated. Accordingly, in a case where polarized light is applied in a wide range, the same region is irradiated with linearly polarized light rays having polarizing axes in different directions, and the loss of the alignment restricting force to be described later is increased. Therefore, by shaping the width of the polarized light in the transport direction into a preset width, the loss of the alignment restricting force can be reduced.

In addition, in the polarized light irradiation device 10, the light shaping unit 15 includes the plate-like body 15A in which the opening 15B corresponding to the width of the polarized light in the transport direction of the irradiation target object 11 is formed. Accordingly, the polarized light can be shaped with a simple configuration.

In addition, the irradiation target object 11 has the photo-alignment film applied on the support. The polarized light irradiation device 10 is suitable for forming an alignment pattern on the irradiation target object 11 having the photo-alignment film.

In addition, the exposure method for the irradiation target object 11 includes an irradiation step of transporting the irradiation target object 11 in a direction orthogonal to the longitudinal direction of the light source unit 12, and shaping polarized light continuously emitted from the light source unit 12 into a preset shape to irradiate the irradiation target object 11 with the shaped polarized light, and an interlocking step of periodically and continuously changing a direction of the linearly polarized light continuously applied to the irradiation target object 11 according to an amount of transport of the irradiation target object 11 relative to the light source unit 12 during the irradiation step.

In the above-described exposure method for the irradiation target object 11, since the direction of the linearly polarized light continuously applied to the irradiation target object 11 is periodically and continuously changed according to the amount of transport of the irradiation target object 11 relative to the light source unit 12, no clear boundary or continuous region is generated in the irradiated portion of the irradiation target object 11. Therefore, an alignment pattern of the irradiated portion having continuous periodicity can be formed on the irradiation target object 11.

<Adjustment of Loss of Alignment Restricting Force>

Hereinafter, a thought of adjusting a loss of the alignment restricting force inevitably occurring in a case where the polarizing axis is changed according to the amount of transport will be described.

Figure 11:
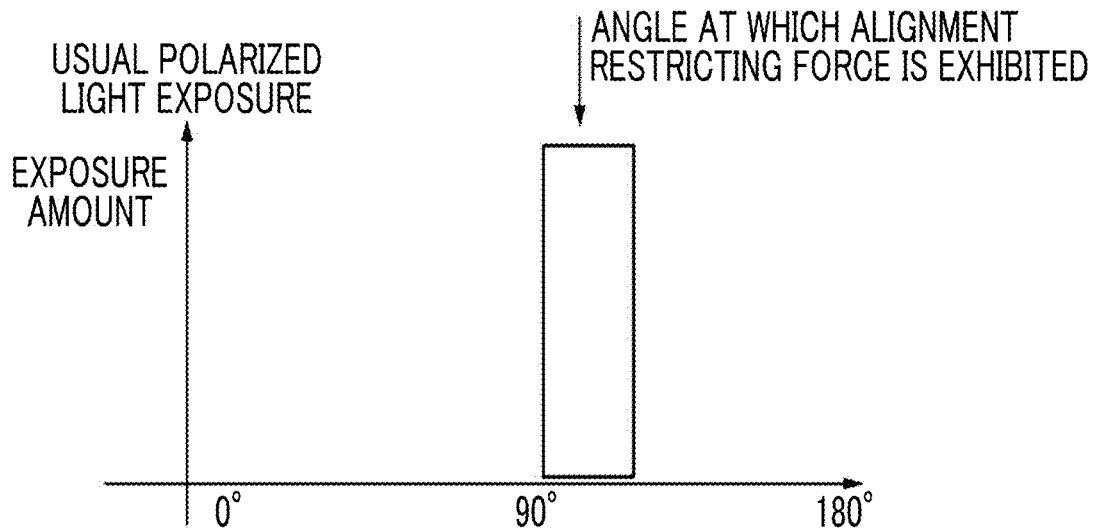
FIG. 11 is a diagram showing a relationship between a polarizing axis and an exposure amount in a case where a polarizing plate in a polarized light irradiation device of a comparative example is not rotated.

As a comparative example, FIG. 11 shows a relationship between the polarizing axis and the exposure amount in a case where the polarizing plate 14 is not rotated. In the comparative example of FIG. 11, the only difference from the polarized light irradiation device 10 of the present disclosure is that the polarizing plate 14 is not rotated, and the shape and size of the opening 15B and the transportation speed of the irradiation target object 11 are the same. In the comparative example, the polarizing axis is constant during the exposure period in which a certain line of the irradiation target object 11 reaches the exposure termination position P2 from the exposure start position P1. Therefore, the alignment restricting force corresponding to the preset polarizing axis is exhibited. In FIG. 11, the width is in the range of about 90° to about 110°, and this is due to the shake of the polarizing axis occurring by a mechanical error of the transport mechanism or the like. In FIG. 11, the alignment restricting force is also exhibited at about 100° in the range of about 90° to about 110° as in the region 41 shown in FIG. 9. In the comparative example shown in FIG. 11, since the polarizing axis is constant, the alignment direction does not change in the transport direction.

However, in the example shown in FIG. 11, since the polarizing axis is constant, the exposure amount corresponding to a specific polarizing axis is larger than that in FIG. 9, and the alignment restricting force is also large. Although the magnitude of the alignment restricting force is limited according to the photosensitive characteristics of the photo-alignment film, the alignment restricting force increases up to a limit with the increasing exposure amount.

Rotating the polarizing axis as in the example shown in FIG. 9 is an essential configuration for obtaining an alignment pattern in which the alignment direction continuously and periodically changes as shown in FIG. 5. However, considering only the magnitude of the alignment restricting force, the amount of rotation that is an integral multiple of 180° in rotating the polarizing axis leads to a loss of the alignment restricting force. Since the potential of the photo-alignment film to exhibit the alignment restricting force is finite, it is preferable that the loss of the alignment restricting force is small.

Ideally, in a case where a width DO (see FIG. 4A) of the opening 15B can be made as small as possible to reduce the amount of rotation of the polarizing axis during the exposure period as much as possible, and a large exposure amount can be instantaneously given, the loss of the alignment restricting force can be reduced. However, actually, reducing the width DO of the opening 15B has a first problem in that there is a processing limit for the light shaping unit 15, and a second problem in that it is difficult to provide a light source capable of instantaneously giving a large exposure amount through the opening 15B having a small width DO.

Accordingly, in the above-described polarized light irradiation device 10, the problem is how to adjust the loss of the alignment restricting force.

As shown in FIGS. 9 and 10, $\Delta\theta$ is a width of the region 41 contributing to the exhibition of the alignment restricting force. In other words, $\Delta\theta$ is an amount of change of the polarizing axis of the polarized light applied during the exposure period in which a certain line of the irradiation target object 11 reaches the exposure termination position P2 from the exposure start position P1. Here, the irradiation width (that is, the width on the irradiation target object 11 corresponding to the width of the opening 15B in a direction orthogonal to the longitudinal direction) is denoted by D (see FIG. 5), and the rotation pitch (that is, the transport distance of the irradiation target object 11 required for 180° rotation of the polarizing plate 14) of the polarizing axis is denoted by $\Lambda$. $\Lambda$ is a length of one period that changes in the range of 0° to 180° in the alignment pattern of the irradiation target object 11.

In this case, $\Delta\theta$ is obtained by the following expression.

$$\Delta\theta = (D \div \Lambda - n) \times 180 \quad \text{Expression 1}$$

(n is the largest integer satisfying $n < D \div \Lambda$)

In this manner, $\Delta\theta$ is obtained by subtracting an integral multiple of 180° from the rotation angle at which the polarizing plate 14 is rotated during the exposure period of a certain line.

In addition, as described above, the alignment restricting force in a certain line is an average angle in the range of AO. Therefore, the larger the AO, the larger the loss of the alignment restricting force, and the smaller the AO, the smaller the loss of the alignment restricting force. This is because the closer the $\Delta\theta$ is to 180°, the larger the amount of cancellation of the alignment restricting force.

Λ is determined by the specifications of a desired alignment pattern for each product. Therefore, Δθ is reduced by reducing D. Accordingly, the loss of the alignment restricting force can be reduced. Specific examples of Λ and D will be described below.

<Λ>

The transport distance Λ required for 180° rotation of the polarizing axis of the applied polarized light can be appropriately selected according to the functional design of a target functional film.

For example, in manufacturing a functional film functioning as a liquid crystal diffraction element, Λ is preferably 0.1 μm or greater and 30 μm or less, and more preferably 0.15 μm or greater and 10 μm or less. In addition, in manufacturing a film patterned retarder used for displaying a three-dimensional image, a functional film incorporated in a polarization control-type dimming film, a depolarization film, an optical element described in JP2014-528597A, or the like, Λ is preferably 1 μm or greater and 300 μm or less, and more preferably 5 μm or greater and 100 μm or less.

<D>

As described above, the irradiation width D is a parameter for adjusting the loss of the alignment restricting force of the photo-alignment film of the irradiation target object 11. From the viewpoint of reducing the loss of the alignment restricting force, in other words, from the viewpoint of improving the efficiency of the exposure energy, D is preferably in the range of 1 time or greater and 20 times or less of Λ, and is more preferably in the range of 2 times or greater and 15 times or less of Λ. In a case where the irradiation width D is in the range of 1 time or greater and 20 times or less of Λ, the exposure energy can be efficiently used and a sufficient exposure amount can be given to the photo-alignment film.

The width DO (see FIG. 4A) of the opening 15B of the light shaping unit 15 can be appropriately designed according to the irradiation width D and a distance H between the light shaping unit 15 and the photo-alignment film of the irradiation target object 11. It is preferable to appropriately design the distance H between the light shaping unit 15 and the photo-alignment film of the irradiation target object 11 and the width DO of the opening 15B in consideration of the effects of diffraction and interference of light.

Next, the exposure amount on the irradiation target object 11 by the light source unit 12 will be described.

The illuminance of the light applied from the light source unit 12 is denoted by S (mW/cm$^2$), the transportation speed of the irradiation target object 11 is denoted by V (mm/sec), and the width of the opening 15B is denoted by DO (mm).

As in the above description, focusing on a certain point of the irradiation target object 11, the irradiation time is DO÷V (sec), and the exposure amount to be obtained is calculated by the following expression.

$$\text{(Exposure Amount mJ/cm}^2) = S \times DO \div V \qquad \text{Expression (2)}$$

Here, the larger the illuminance S and the width DO of the opening 15B, and the lower the transportation speed V of the irradiation target object 11, the larger the exposure amount can be acquired. However, in a case where the width DO is increased, the loss of the alignment restricting force becomes large. In addition, in a case where the width DO of the opening 15B is set to be too small, a light source having an extremely large quantity of light emission per unit time is required with the increasing difficulty in processing of the opening 15B. Therefore, the width DO is limited. Therefore, actually, it is preferable to adjust S and V to give a sufficient exposure amount.

The above-described sufficient exposure amount differs depending on the photo-alignment material contained in the irradiation target object. This is because, as the photo-alignment material, a cinnamate compound, an azo compound, a compound containing a Fries rearrangement-functional group, a photodegradable polyimide compound, and the like are known, and the characteristics such as an amount of the exposure energy necessary for exhibition of the alignment restricting force differ depending on the kind of the photo-alignment material. In implementing the technology of the present disclosure, the technology can be applied to various photo-alignment materials without limit by appropriately adjusting S and V in consideration of the characteristics of the photo-alignment materials.

Second Embodiment

Next, a polarized light irradiation device of a second embodiment will be described. A polarized light irradiation device 10 of the second embodiment has the same configuration as that in the first embodiment shown in FIG. 1, and the only difference is the setting of the rotation speed of a polarizing plate 14. Therefore, in a case where the same constituent elements, members, and the like are provided, these are denoted by the same reference numerals, and detailed description thereof will be omitted.

Figure 12A:
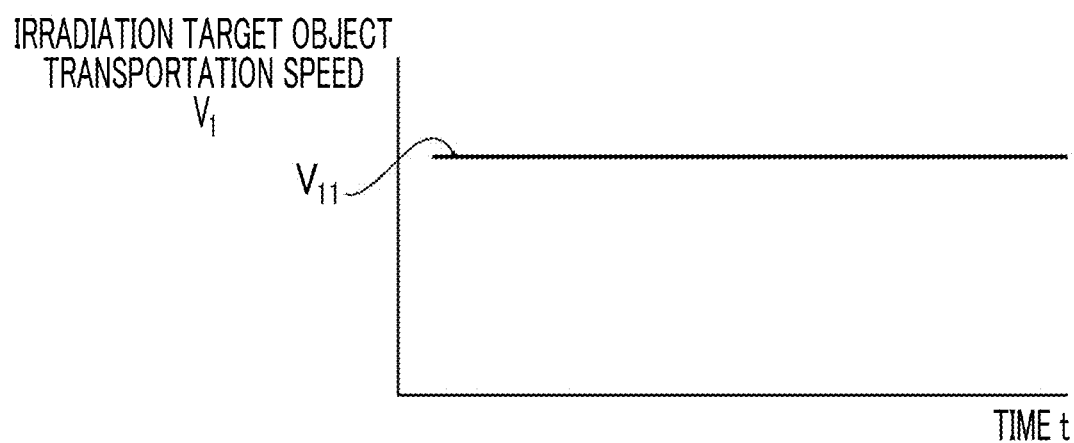
FIG. 12A is a graph showing a second example of the relationship between a time and a transportation speed of the irradiation target object.
Figure 12B:
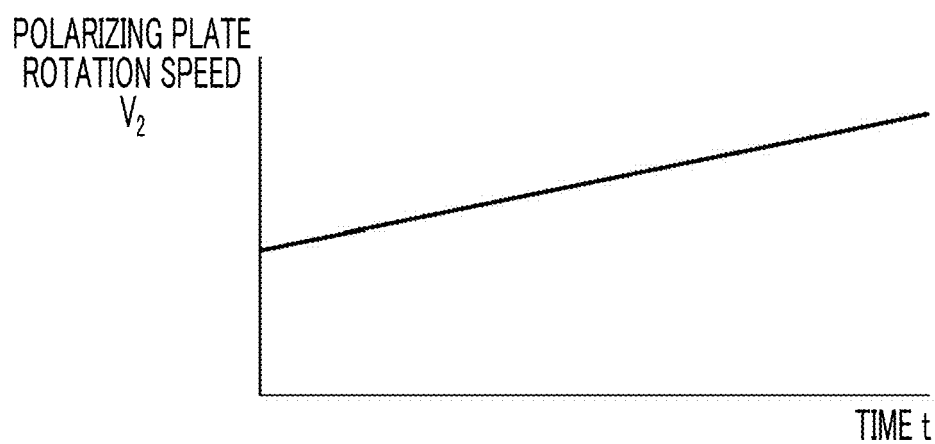
FIG. 12B is a graph showing a second example of the relationship between a time and a rotation speed of the polarizing plate.

As shown in FIG. 12A, in the second embodiment, a transportation speed V1 of an irradiation target object 11 with respect to a time t at which the irradiation target object 11 is transported is also set to a predetermined constant value (V11) as in the first embodiment. In the second embodiment, as shown in FIG. 12B, a rotation speed V2 of the polarizing plate 14 with respect to a time t at which the polarizing plate 14 is rotated is set to be gradually increased at a predetermined gradient. That is, the amount of rotation of the polarizing plate 14 with respect to the amount of transport of the irradiation target object 11 is gradually increased.

Under the above conditions, a photo-alignment film of the irradiation target object 11 is irradiated with polarized light that has passed through an opening 15B of a light shaping unit 15. Configurations other than the above conditions are the same as those of the polarized light irradiation device 10 of the first embodiment.

Figure 13:
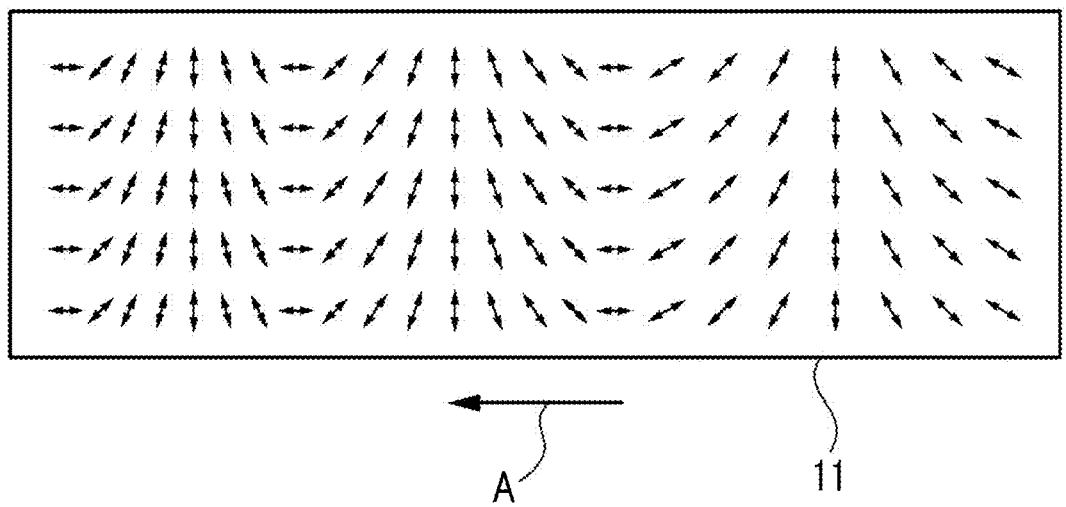
FIG. 13 is a plan view showing a second example of the alignment pattern formed on the irradiation target surface of the irradiation target object.

As shown in FIG. 13, a continuous alignment pattern in which the alignment direction periodically rotates by 180° is formed on the photo-alignment film of the irradiation target object 11, and along with an increase of the amount of rotation of the polarizing plate 14, the period in which the alignment direction changes between 0° and 180 in the transport direction of the irradiation target object 11 is narrowed.

The period in which the alignment direction changes corresponds to the above-described transport distance A required for 180° rotation of the polarizing axis of the applied polarized light. By changing the rotation speed of the polarizing plate 14, A can be changed in the exposure step for the same photo-alignment film. The alignment pattern as shown in FIG. 13 includes a plurality of regions having different diffraction wavelengths and/or diffraction angles depending on the position in the plane of the photo-alignment film. According to the second embodiment, a liquid crystal diffraction element having such characteristics can be formed.

In the alignment pattern of FIG. 13, the period in which the alignment direction changes is gradually shortened, but the fact that the alignment direction periodically changes between 0° and 180° is the same as in the first embodiment.

In the technology of the present disclosure, the periodic change of the direction of linearly polarized light means the periodic change of the alignment direction, including the example of FIG. 13.

By changing the rotation speed of the polarizing plate 14, the period in which the alignment direction changes in the transport direction can be changed. The rotation speed of the polarizing plate 14 is an example of a rotation speed at which the direction of linearly polarized light is rotated.

In addition, in the second embodiment, the description has been given with the example in which only the rotation speed of the polarizing plate 14 is changed, but the transportation speed of the irradiation target object 11 may also be changed. In addition, only the transportation speed of the irradiation target object 11 may be changed while the rotation speed of the polarizing plate 14 is kept constant. In this manner, by controlling at least one of the rotation speed or the transportation speed, various alignment patterns according to the purpose can be obtained.

Third Embodiment

Next, a polarized light irradiation device of a third embodiment will be described. A basic configuration of the polarized light irradiation device of the third embodiment is the same as that of the polarized light irradiation device 10 of the first embodiment. In the third embodiment, in a case where the same constituent elements, members, and the like as those in the first and second embodiments are provided, these are denoted by the same reference numerals, detailed description thereof will be omitted, and differences will be mainly described.

Figure 14:
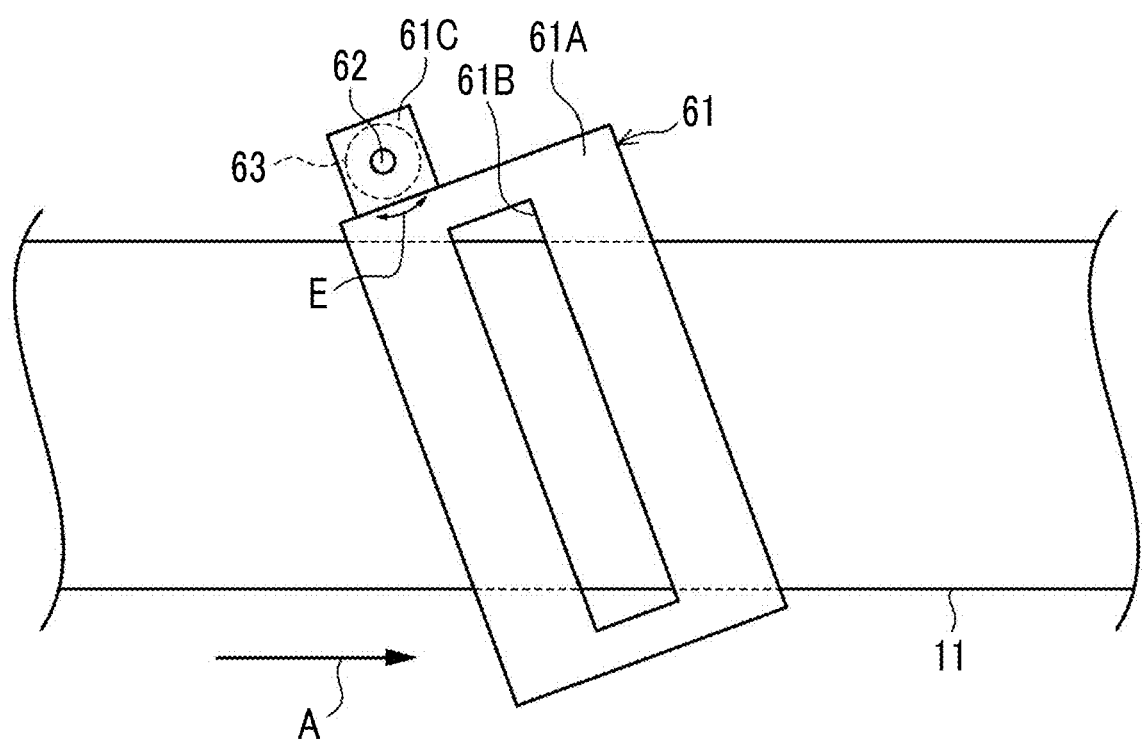
FIG. 14 is a perspective view showing a third example of the light shaping unit and the irradiation target object.

FIG. 14 shows a light shaping unit 61 of the third embodiment. As shown in FIG. 14, in the polarized light irradiation device 10 of the third embodiment, the arrangement of the light shaping unit 61 in a transport direction (direction of arrow A) of an irradiation target object 11 is changed. The light shaping unit 61 includes a rectangular plate-like body 61A and a rectangular opening (for example, slit) 61B formed in the plate-like body 61A. A mounting unit 61C extending in a longitudinal direction of the plate-like body 61A is provided at a corner portion of the plate-like body 61A. A shaft unit 62 is attached to the mounting unit 61C. A motor 63 is connected to the shaft unit 62, and the shaft unit 62 is rotated in a direction of the arrow E by the motor 63, so that the plate-like body 61A can be rotated via the mounting unit 61C.

By rotating the plate-like body 61A, the opening 61B of the light shaping unit 61 is disposed in a posture in which a longitudinal direction of the opening 61B is inclined with respect to the transport direction (for example, direction of the arrow A) of the irradiation target object 11. In other words, the opening 61B of the light shaping unit 61 is disposed so that the longitudinal direction of the opening 61B intersects the transport direction of the irradiation target object 11 at an angle different from 90°. In this manner, the opening 61B may be disposed in a posture in which the longitudinal direction of the opening 61B is inclined with respect to the transport direction of the irradiation target object 11. In addition, by rotating the plate-like body 61A by the motor 63, the inclined angle at which the opening 61B is inclined can be changed. The motor 63 is an example of an inclined angle changing unit.

In the third embodiment, the photo-alignment film of the irradiation target object 11 is irradiated with polarized light that has passed through the opening 61B of the light shaping unit 61 in a state in which the opening 61B of the light shaping unit 61 is disposed in a posture inclined with respect to the transport direction of the irradiation target object 11. Configurations other than the above conditions are the same as those of the polarized light irradiation device 10 of the first embodiment.

Figure 15:
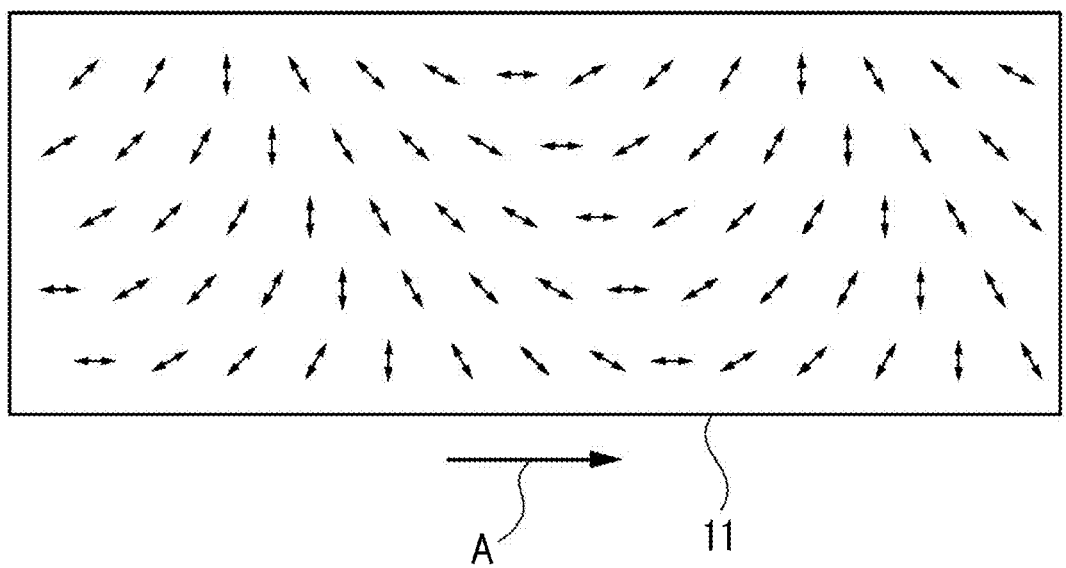
FIG. 15 is a plan view showing a third example of the alignment pattern formed on the irradiation target surface of the irradiation target object.
Figure 16:
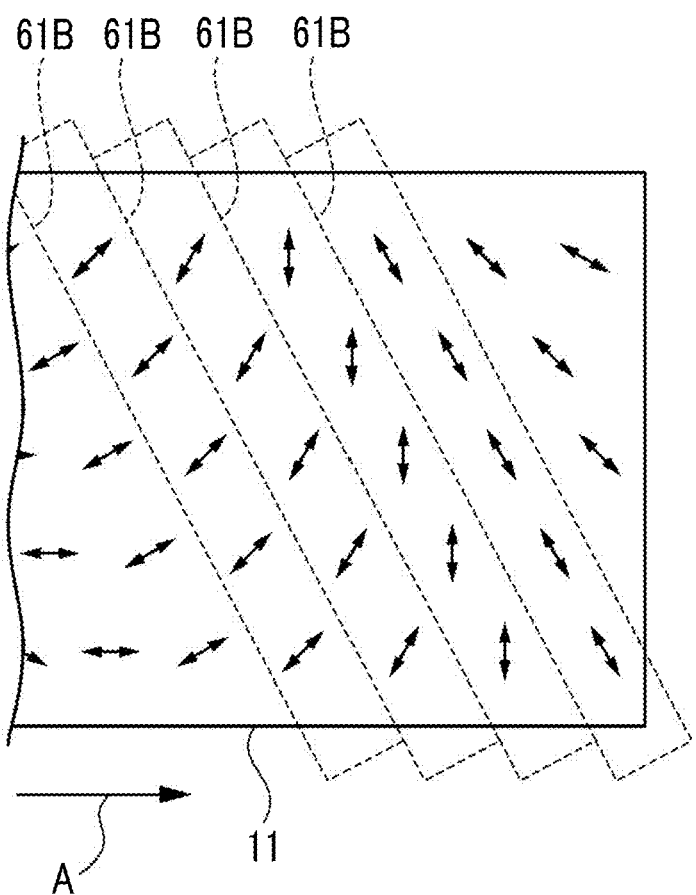
FIG. 16 is an enlarged plan view showing the third example of the alignment pattern formed on the irradiation target surface of the irradiation target object.

As shown in FIG. 15, an alignment pattern in which the alignment direction periodically changes is formed on the photo-alignment film of the irradiation target object 11. As shown in FIG. 16, an alignment pattern in which according to the inclined angle of the opening 61B of the light shaping unit 61 with respect to the transport direction of the irradiation target object 11, the same alignment direction is disposed in an oblique direction to the transport direction of the irradiation target object 11 is formed on the photo-alignment film of the irradiation target object 11. The alignment pattern has periodicity in the transport direction of the irradiation target object 11 while maintaining the inclined direction.

In the above-described polarized light irradiation device 10, the following effects are obtained in addition to the effects of the same configurations as in the first and second embodiments. In the above-described polarized light irradiation device 10, the opening 61B is disposed in a posture in which the longitudinal direction of the opening 61B is inclined with respect to the transport direction of the irradiation target object 11. Therefore, the direction of the alignment pattern of the irradiation target object 11 can be inclined according to the inclined angle of the opening 61B as shown in FIGS. 15 and 16. In addition, since the polarized light irradiation device 10 includes the inclined angle changing unit such as the motor 63, the inclined angle at which the opening 61B is inclined can be easily adjusted.

In the third embodiment, the description has been given with the example in which the inclined angle of the opening 61B can be changed by the motor 63 which is an example of the inclined angle changing unit. However, at least the opening 61B may be set to be inclined at a target inclined angle, and the inclined angle may not be variable.

Fourth Embodiment

Next, a polarized light irradiation device of a fourth embodiment will be described. In the fourth embodiment, in a case where the same constituent elements, members, and the like as those in the first to third embodiments are provided, these are denoted by the same reference numerals, and detailed description thereof will be omitted.

Figure 17:
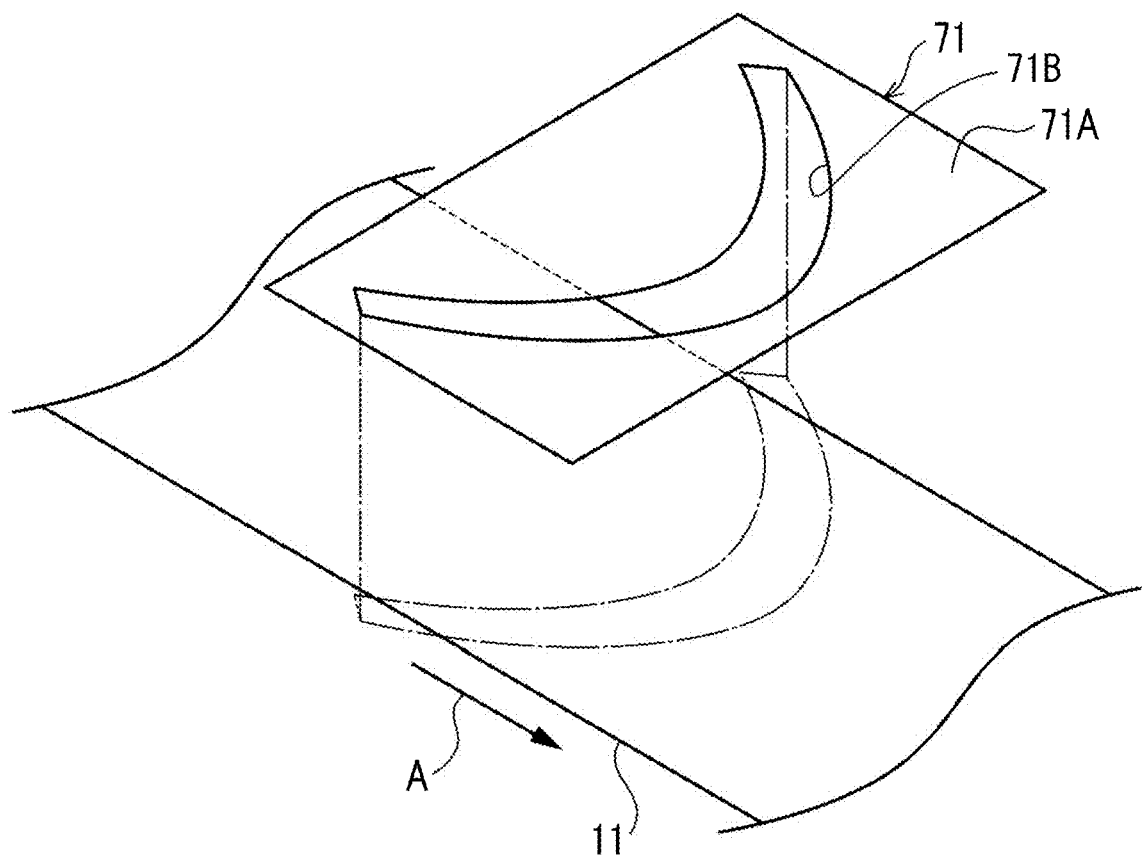
FIG. 17 is a perspective view showing a fourth example of the light shaping unit and the irradiation target object.

FIG. 17 shows a light shaping unit 71 of the fourth embodiment. As shown in FIG. 17, in a polarized light irradiation device 10 of the fourth embodiment, the shape of the light shaping unit 71 is changed. The light shaping unit 71 includes a rectangular plate-like body 71A and an arc-like opening (for example, slit) 71B formed in the plate-like body 71A. More specifically, the opening 71B has an arc shape having a straight line along a width direction of an irradiation target object 11 as a chord. The opening 71B is bilaterally symmetrical along the width direction of the irradiation target object 11. Both end portions of the opening 71B of the plate-like body 71A in a longitudinal direction are disposed on the upstream side in a transport direction (that is, direction of the arrow A) of the irradiation target object 11. Furthermore, a central portion of the opening 71B in the longitudinal direction has a shape protruding curvedly from the both end portions of the opening 71B in the longitudinal direction toward the downstream side in the transport direction (that is, direction of the arrow A) of the irradiation target object 11.

In the polarized light irradiation device 10 of the fourth embodiment, a photo-alignment film of the irradiation target object 11 is irradiated with polarized light that has passed through the arc-like opening 71B of the light shaping unit 71. Configurations other than the above conditions are the same as those of the polarized light irradiation device 10 of the first embodiment.

Figure 18:
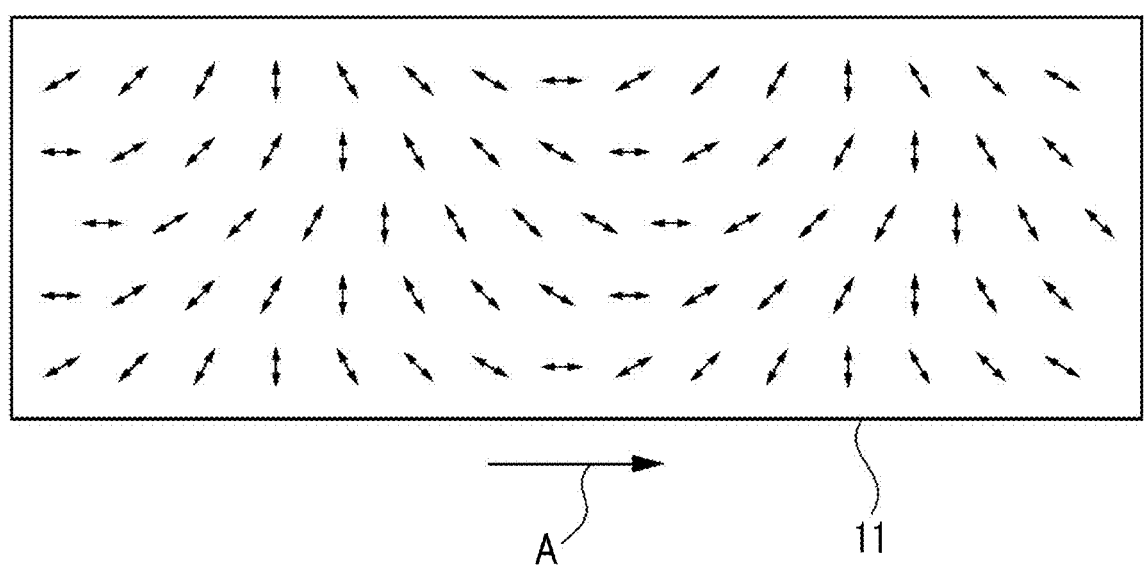
FIG. 18 is a plan view showing a fourth example of the alignment pattern formed on the irradiation target surface of the irradiation target object.
Figure 19:
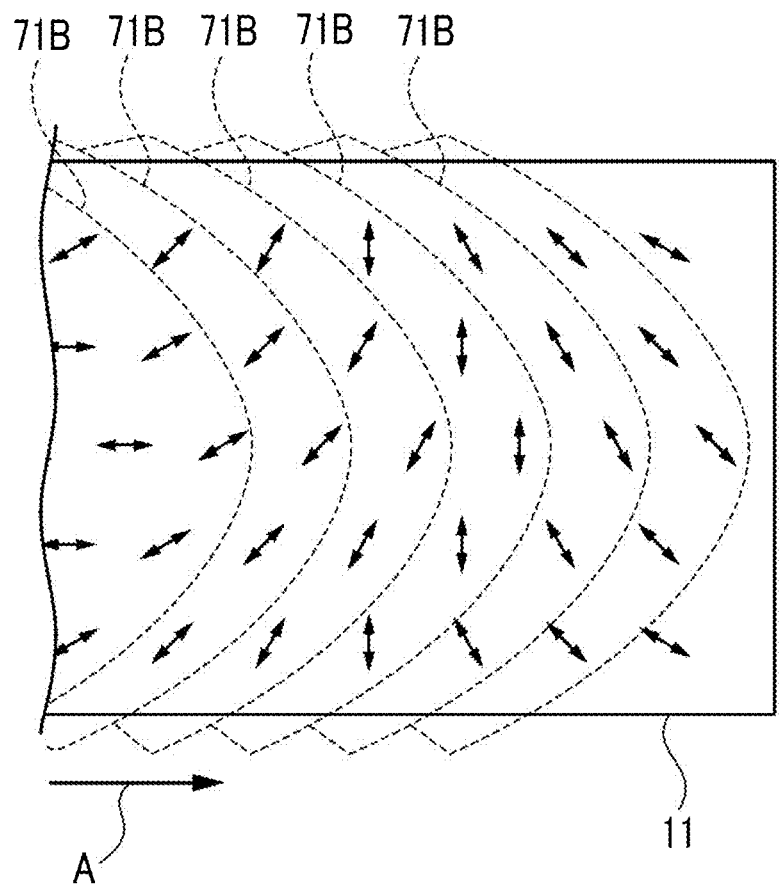
FIG. 19 is an enlarged plan view showing the fourth example of the alignment pattern formed on the irradiation target surface of the irradiation target object.

As shown in FIG. 18, a continuous alignment pattern in which the alignment direction is rotated by 180° at a pitch of a period determined in a direction of the arrow A is formed on the photo-alignment film of the irradiation target object 11. As shown in FIG. 19, a periodic alignment pattern in which according to the shape of the arc-like opening 71B of the light shaping unit 71, the alignment direction is disposed in an arc shape with respect to the transport direction of the irradiation target object 11 is formed on the photo-alignment film of the irradiation target object 11.

In the above-described polarized light irradiation device 10, the same effects can be obtained by the same configuration as in the first to third embodiments.

In the fourth embodiment, the description has been given with the example in which the shape of the opening 71B is an arc shape, but the shape may be a shape other than the arc shape or a curved shape curved in the width direction of the irradiation target object 11. For example, the shape may be a wave shape having a plurality of peaks. Various alignment patterns can be formed by forming the opening 71B having a curved shape as in the fourth embodiment, instead of a rectangular shape such as the opening 15B shown in the first embodiment and the like.

[Others]

In the first to fourth embodiments, the transport device 16 which transports the long irradiation target object 11 in the direction of the arrow A is used, but the technology of the present disclosure is not limited to the above configuration. For example, a configuration in which a stage on which the irradiation target object is disposed is moved in a predetermined direction (for example, X and Y directions orthogonal to each other) may be employed.

In addition, the polarized light irradiation device of the present disclosure may have a configuration in which instead of the light source unit 12 and the control unit 17 of the above-described embodiments, a light source unit continuously emits elliptically polarized light, and according to the amount of transport of the irradiation target object relative to the light source unit by the transport device, the azimuthal angle of the elliptically polarized light applied to the irradiation target object is periodically and continuously changed.

In addition, the irradiation target object of the present disclosure may have a configuration in which a resin film is used as a support and a photo-alignment film is formed on the resin film, or a configuration in which a glass plate is used as a support and a photo-alignment film is formed on the glass plate.

EXAMPLES

Hereinafter, examples for verifying the polarized light irradiation device will be described.

A small light source UV Hoya EX250 was used for a light source unit, and the illuminance was about 250 mW/cm$^2$. As a polarizing plate, a commercially available PVA polarizing plate was used, and the polarizing plate was mounted on a stepping motor and rotated. The polarizing plate was interlocked with a transport control unit of a transport device by an electric circuit. As a light shaping unit, a matte-black plate having a width of 1 mm in a direction orthogonal to a longitudinal direction of an opening (in the example, slit) and a length of 1 cm in the longitudinal direction of the opening (in the example, slit) was used. A piezo stage was used as the transport device, and the resolution was 5 μm.

The transportation speed of the stage was 75 μm/sec. The rotation speed of the polarizing plate was synchronized with the transportation speed of the stage so that a transport distance A required for 180° rotation of the polarizing axis of polarized light was 150 μm, and a photo-alignment film of an irradiation target object on the stage was irradiated with the polarized light. As the photo-alignment film of the irradiation target object, a commercially available azo compound-based photo-alignment film applied on a glass plate was used.

(Confirmation Result)

A polymerizable liquid crystal composition containing a polymerizable rod-like liquid crystal compound was applied onto the obtained photo-alignment film that had been subjected to the pattern alignment treatment. After liquid crystal alignment, a retardation layer in which the alignment state was fixed by a polymerization reaction was provided. The "film thickness" of the retardation layer was set so that the product Δn×d of the refractive index anisotropy Δn and the film thickness d of the polymerizable liquid crystal composition at the time of horizontal alignment was approximately 140 nm.

Figure 20:
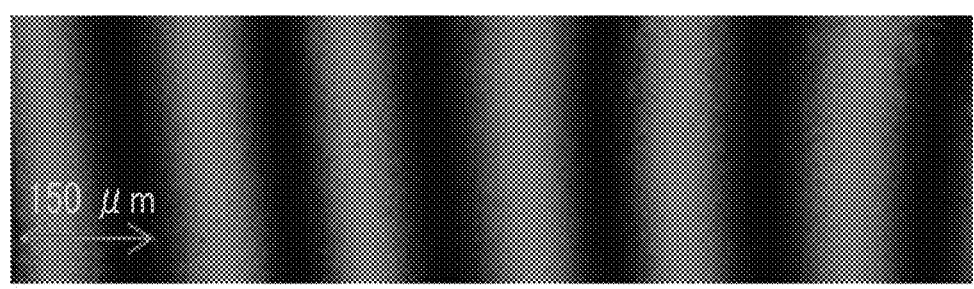
FIG. 20 is an image obtained by observing the irradiation target surface of the irradiation target object.

The obtained optical element was placed between a pair of polarizing plates disposed in a crossed Nicol state and observed. FIG. 20 shows an observation result of the optical element. As shown in FIG. 20, a periodic stripe pattern was observed, and it was confirmed that regarding the alignment state, A was formed with a period of 150 μm to 150 nm.

(Consideration from Verification Examples)

(1) Λ=150 μm, estimated from the interlocking of the rotation of the polarizing plate with the transport of the irradiation target object, and the period of an alignment pattern actually formed substantially coincided with each other, and the correlation between the transport distance Λ and the period of the alignment pattern was shown.

(2) It was shown that the total rotation angle of the polarizing axis in an irradiation width D was as wide as 1,200° (for example, about 180° rotation was performed 6 or 7 times), but actually, an alignment pattern in which the alignment restricting force was exhibited was formed, and it was possible to apply the alignment restricting force although there was a large loss in converting the input exposure energy into the alignment restricting force.

The exposure amount on the irradiation target object in a general uniform exposure system is 10 mJ/cm$^2$ or greater and 30 mJ/cm$^2$ or less.

The exposure amount on the irradiation target object by the light source unit of the polarized light irradiation device of this example is calculated by Formula (2) described above.

(Exposure Amount mJ/cm$^2$)=$S$ (illuminance)×$DO$ (width of opening)÷$V$ (transportation speed)　　Expression (2)

In a case where actual numerical values are applied, the exposure amount is as follows.

250 (mW/cm$^2$)×1,000 (μm)÷75 (μm/sec)=about 3,300 mJ/cm$^2$

Thus, it was confirmed that since there is a limit to increasing the irradiation width D, the illuminance S and the transportation speed V can be adjusted to give a sufficient exposure amount.

In the above-described embodiments, the following various processors can be used as a hardware structure of the processing unit such as the control unit 17 which executes various processes. The various processors include, as described above, a CPU which is a general-purpose processor which executes software and functions as various processing units, a programmable logic device (PLD) which is a processor having a circuit configuration which can be changed after manufacturing of a field programmable gate array (FPGA) or the like, a dedicated electric circuit which is a processor having a circuit configuration specially designed for executing a specific process such as an application specific integrated circuit (ASIC), and the like.

One processing unit may be composed of one of these various processors, or a combination of two or more processors of the same type or different types (for example, a combination of a plurality of FPGAs and/or a combination of a CPU and a FPGA). In addition, a plurality of processing units may be composed of one processor.

As an example in which a plurality of processing units are composed of one processor, there is a form in which one processor is composed of a combination of one or more CPUs and software, and functions as a plurality of processing units. Secondly, as typified by system on chip (SoC), there is a form in which a processor which realizes the functions of the whole system including a plurality of processing units by one integrated circuit (IC) chip is used. As described above, the various processing units are configured by using one or more of the above-described various processors as a hardware structure.

Furthermore, as a hardware structure of the various processors, more specifically, an electric circuit (circuitry) in which circuit elements such as semiconductor elements are combined can be used.

Although the examples of the present disclosure have been described as above, it is needless to say that the present disclosure is not limited to the above-described examples and can be carried out in various embodiments without departing from the gist of the present disclosure.

The disclosure of JP2019-179606 is incorporated herein by reference in its entirety.

All literatures, patent applications, and technical standards described herein are incorporated herein by reference to the same extent as if each literature, patent application, or technical standard is specifically and individually indicated as being incorporated by reference.

What is claimed is:

1. A polarized light irradiation device comprising:
   a light source unit which continuously emits polarized light;
   a light shaping unit which shapes the polarized light emitted from the light source unit into a preset shape to irradiate an irradiation target object with the shaped polarized light;
   a transport mechanism which transports the irradiation target object relative to the light source unit; and
   an interlocking mechanism which periodically and continuously changes a direction of linearly polarized light or an azimuthal angle of elliptically polarized light applied to the irradiation target object according to an amount of transport of the irradiation target object relative to the light source unit by the transport mechanism.

2. The polarized light irradiation device according to claim 1,
   wherein the light source unit has a longitudinal direction, and the transport mechanism transports the irradiation target object in a direction orthogonal to the longitudinal direction of the light source unit.

3. The polarized light irradiation device according to claim 2,
   wherein a length of the light source unit in the longitudinal direction is longer than a width of the irradiation target object in a direction orthogonal to a transport direction of the irradiation target object.

4. The polarized light irradiation device according to claim 2,
   wherein the light shaping unit shapes a width of the polarized light in a transport direction of the irradiation target object into a preset width.

5. The polarized light irradiation device according to claim 3,
   wherein the light shaping unit includes a plate-like body in which an opening corresponding to the width is formed.

6. The polarized light irradiation device according to claim 5,
   wherein the opening is disposed in a posture in which a longitudinal direction of the opening is inclined with respect to the transport direction of the irradiation target object.

7. The polarized light irradiation device according to claim 5, further comprising an inclined angle changing unit which changes an inclined angle at which the opening is inclined.

8. The polarized light irradiation device according to claim 5,
   wherein the opening has a rectangular shape having a long side along a width direction of the irradiation target object or a curved shape curved in the width direction of the irradiation target object.

9. The polarized light irradiation device according to claim 1,
   wherein the polarized light emitted from the light source unit is linearly polarized light, and
   the interlocking mechanism continuously changes the direction of the linearly polarized light applied to the irradiation target object.

10. The polarized light irradiation device according to claim 1,
    wherein the interlocking mechanism is capable of changing at least one of a transportation speed of the irradiation target object transported by the transport mechanism or a rotation speed at which the direction of the linearly polarized light or the azimuthal angle of elliptically polarized light is rotated.

11. The polarized light irradiation device according to claim 1,
    wherein the irradiation target object has a photo-alignment film applied on a support.

12. An exposure method for an irradiation target object comprising:
    an irradiation step of transporting the irradiation target object in a direction orthogonal to a longitudinal direction of a light source unit, and shaping polarized light continuously emitted from the light source unit into a preset shape to irradiate the irradiation target object with the shaped polarized light; and
    an interlocking step of periodically and continuously changing a direction of linearly polarized light or an azimuthal angle of elliptically polarized light continuously applied to the irradiation target object according to an amount of transport of the irradiation target object relative to the light source unit during the irradiation step.

\* \* \* \* \*